United States Patent
Atanackovic

(10) Patent No.: US 7,645,517 B2
(45) Date of Patent: Jan. 12, 2010

(54) RARE EARTH-OXIDES, RARE EARTH NITRIDES, RARE EARTH PHOSPHIDES AND TERNARY ALLOYS WITH SILICON

(75) Inventor: Petar B. Atanackovic, Palo Alto, CA (US)

(73) Assignee: Translucent, Inc., Palo Alto, CA (US)

( * ) Notice: Subject to any disclaimer, the term of this patent is extended or adjusted under 35 U.S.C. 154(b) by 0 days.

(21) Appl. No.: 11/025,692

(22) Filed: Dec. 28, 2004

(65) Prior Publication Data
US 2005/0161773 A1    Jul. 28, 2005

Related U.S. Application Data

(60) Continuation-in-part of application No. 10/825,974, filed on Apr. 16, 2004, now Pat. No. 6,858,864, which is a continuation of application No. 10/666,897, filed on Sep. 17, 2003, now Pat. No. 7,023,011, which is a division of application No. 09/924,392, filed on Aug. 7, 2001, now Pat. No. 6,734,453.

(60) Provisional application No. 60/223,874, filed on Aug. 8, 2000, provisional application No. 60/533,378, filed on Dec. 29, 2003.

(51) Int. Cl.
B32B 9/04 (2006.01)
B32B 13/04 (2006.01)
B32B 9/00 (2006.01)
B32B 19/00 (2006.01)

(52) U.S. Cl. ............ 428/446; 428/448; 428/698; 428/700; 428/701; 428/702

(58) Field of Classification Search ........... 501/97.2; 428/446, 698, 701, 702
See application file for complete search history.

(56) References Cited

U.S. PATENT DOCUMENTS

| 5,474,976 | A  |   | 12/1995 | Kondoh et al. |
| 5,531,182 | A  | * | 7/1996  | Yonehara .............. 117/7 |
| 5,728,213 | A  |   | 3/1998  | Kurata et al. |
| 5,801,105 | A  | * | 9/1998  | Yano et al. ............ 438/785 |
| 6,100,120 | A  | * | 8/2000  | Yu .................... 438/151 |
| 6,171,959 | B1 | * | 1/2001  | Nagabushnam ......... 438/683 |

(Continued)

OTHER PUBLICATIONS

Yoshimoto et al "Room temperature Epitaxial Growth of CeO2 thin films on Si (111) substrates for fabrication of Sharp oxide/Silicon Interface" Jap. J. App. Phys. vol. 34 (1995) pp. L688-L690, Part 2, No. 6A, Jun. 1, 1995.*

(Continued)

*Primary Examiner*—Timothy M Speer
*Assistant Examiner*—Jonathan C Langman
(74) *Attorney, Agent, or Firm*—Fernandez & Associates, LLP

(57) ABSTRACT

Atomic layer epitaxy (ALE) is applied to the fabrication of new forms of rare-earth oxides, rare-earth nitrides and rare-earth phosphides. Further, ternary compounds composed of binary (rare-earth oxides, rare-earth nitrides and rare-earth phosphides) mixed with silicon and or germanium to form compound semiconductors of the formula RE—(O, N, P)—(Si,Ge) are also disclosed, where RE=at least one selection from group of rare-earth metals, O=oxygen, N=nitrogen, P=phosphorus, Si=silicon and Ge=germanium. The presented ALE growth technique and material system can be applied to silicon electronics, opto-electronic, magneto-electronics and magneto-optics devices.

5 Claims, 14 Drawing Sheets

U.S. PATENT DOCUMENTS 6,469,357 B1 * 10/2002 Hong et al. ............... 257/410
2002/0050608 A1 * 5/2002 Landheer et al. .......... 257/310
2003/0183885 A1 10/2003 Nishikawa et al.

OTHER PUBLICATIONS

Chemblink: Gadolinium Oxide, (http://www.chemblink.com/products/12064-62-9.htm), retrieval Date Dec. 1, 2008.*

McKee et al., "Crystalline Oxides on Silicon: The First Five Monolayers" Physical Review Letters, Colume 81, No. 14, Oct. 1998, pp. 3014-3017.*

Amato, Ivan. "Motorola's Superchip." Technology Review. (Apr. 2002). MIT. Feb. 2, 2009 <http://www.technologyreview.com/computing/12788/>.

* cited by examiner

US 7,645,517 B2

RARE EARTH-OXIDES, RARE EARTH NITRIDES, RARE EARTH PHOSPHIDES AND TERNARY ALLOYS WITH SILICON

CROSS-REFERENCE TO RELATED APPLICATIONS

This application claims benefit of U.S. provisional patent application Ser. No. 60/533,378 filed on 29 Dec. 2003, and is also a continuation-in-a-part of U.S. Ser. No. 10/825,974 filed Apr. 16, 2004 now U.S. Pat. No. 6,858,864, which is a continuation of U.S. Ser. No. 10/666,897 filed Sep. 17, 2003 now U.S. Pat. No. 7,023,011, which is a divisional of Ser. No. 09/924,392 filed Aug. 7, 2001 now U.S. Pat. No. 6,734,453, which claims the benefit of U.S. Ser. No. 60/223,874 filed Aug. 8, 2000, all of which applications are herein incorporated by reference.

BACKGROUND OF THE INVENTION

1. Field of the Invention

The invention relates generally to compositions, structures and devices for silicon-on-insulator (SOI) compositions, devices and applications, and more particularly to compositions, structures and devices utilizing substantially single crystal compositions for SOI compositions, devices and applications.

2. Description of the Related Art

It is well known that pure crystal or single-crystal rare-earth oxides (REOx), rare-earth nitrides (REN) and rare-earth phosphides (REP) do not occur in nature, nor can they be grown using prior-art growth techniques. For this reason, single crystalline oxides, nitrides and phosphides compatible and functionalized for use with ultra large scale integrated (USLI) silicon electronics processing has to date eluded the silicon electronics industry. In contrast, amorphous oxides are comparatively straightforward to realize. Modern silicon electronics owes a large part of the enormous success to the robust native oxide of silicon, that is, stoichiometric silicon dioxide ($SiO_2$). The crystalline Si and amorphous $SiO_2$ interface can be prepared as an almost perfect defect free interface. The high quality of the Si/$SiO_2$ interface is difficult to replicate in practically any other material system.

This inability to create single-crystal oxides affects three major application areas as recited hereafter.

Future ULSI technology node scaling into the deep sub-micron regime requires ultrathin gate oxides of $SiO_2$ for use in field effect transistors (FETs) to be of the order of 1-10 nanometers in thickness. Unfortunately, fundamental physics problems at such small $SiO_2$ thickness appear: (i) large quantum mechanical tunneling gate current; (ii) dielectric breakdown; and (iii) reliability degradation. These problems require alternate gate materials, (such as higher dielectric constant oxides) and modified Si substrates, such as silicon-on-insulator (SOI), to be introduced into ULSI technology nodes.

Complementary to the Si electronics industry is the demand for semiconductor materials which are optically active and compatible with Si processing technology. To date there does not exist a clear answer to this Si industry compatibility issue for optoelectronic materials. Efficient and inexpensive electrically driven planar photonic Si-based devices operating at fiber communications wavelengths are the driving rationale for solving optoelectronic integration with mainstream Si electronics. One path toward such a goal is the creation of a material that can be relatively easily fabricated and integrated with Si-based ULSI electronics manufacturing. This philosophy is a potential solution for reducing optoelectronic system manufacturing costs. Further, optoelectronic emitters and absorbers operating at 1.5 micron wavelengths that are readily integrable with silicon electronics offer an explosive increase in functionality and reduction in cost/function. Using the present invention, active and passive photonic elements can be integrated along side, above or beneath planar complementary metal oxide semiconductor (CMOS) electronics. For example, U.S. Pat. No. 6,734,453, describes how a single crystal photonic layer can be buried beneath an active CMOS layer. This approach allows the photonic and electronic layers to be separately optimized. Furthermore, silicon-based rare-earth containing multi-layers are disclosed.

Finally, there is also a demand for higher density and function magnetic storage materials. Simplistically, a magnetic media which can be processed using ULSI tools is of great interest. However, once again a clear answer does not presently exist. The present invention allows the use of high densities of magnetic rare-earth ions in a single crystal form. The utility of the said magnetic single crystal, for example single crystal rare-earth oxide, is that can be: (i) deposited as a thin film compatible with silicon; and (ii) the possibility of using silicon microelectronics for electrical read/write access for the storage of information using the intrinsic properties of the confined magnetic ions.

There are primarily two critical mainstream Si electronics issues in areas of ULSI FET gate oxides and silicon-on-insulator materials. The two areas have been historically separate concerns and are elegantly related for the first time using present invention. The present invention potentially solves both areas individually and/or allows an integrated approach by virtue of the unique fact the present invention is: (i) single crystal; (ii) a high-k dielectric; (iii) commensurate with and may be epitaxially deposited with substantially single crystal silicon; and further (iv) multilayers of single crystal silicon and single crystal rare-earth oxides may be deposited at will.

A possible solution to the USLI gate oxide problem, is the substitution of $SiO_2$ with a material of higher dielectric constant, so-called "high-k dielectrics". A possible short-term dielectric material is the incorporation of nitrogen in $SiO_2$ to form silicon oxynitride ($SiO_xN_y$). Possible candidate long term high-k solutions are oxides of titanium oxide ($TiO_2$), tantalum pentoxide ($Ta_2O_5$), hafnium oxide ($HfO_2$), zirconium oxide ($ZrO_2$) and aluminum oxide ($Al_2O_3$). Alloys and/or combinations of the above materials may also prove effective in leveraging advantageous features of each high-k binary oxide, such as $HfZrO_4$. Similarly, high-k binary oxides combined with $SiO_2$ or Si, such as zircon $HfSiO_4$ or $HfSiO_2$, may also prove to be effective gate oxides.

However, to date all such alternative gate oxide candidates mentioned above fail in one or more areas of required device performance.

These areas include (i) bulk gate material quality; (ii) silicon/gate oxide interface quality; (iii) gate material conduction and valence band offsets with respect to bulk Si; (iv) breakdown strength; (v) gate oxide band gap; and (vi) growth technique. Further, practically all technologically relevant oxides investigated as possible replacement gate materials to date are either amorphous or at best polycrystalline. Worthy of note is the perovskite-like crystal, strontium titanate, $SrTiO_3$ (STO). This particular compound can be grown with limited thickness as a single crystal on Si(001)-oriented wafers. However, crystallinity in this case is not sufficient criterion for FET gate oxide suitability. Unfortunately, the silicon/STO hetero-junction offset is almost entirely located in the valence band- and therefore is unsuited to Si-based ULSI FET devices.

One current growth technique for precise ultrathin oxide layer deposition is a variant of well established chemical vapor deposition (CVD) techniques. Gate oxide layer thickness of the order 1-10 nanometers (nm) requires a complex pulsed reactive hydride and chloride precursor gas based deposition/purge cycle CVD process based on U.S. Pat. No. 4,058,430—presently termed atomic layer deposition (ALD). Recent success of the ALD process for demonstration of ultrathin oxides mentioned above, unfortunately neglects specific problems related to practical ULSI device issues:

Central to the inadequacy of $SiO_2$ as a viable ultrathin gate oxide is the presence of impurities, primarily those related to hydrogen, which are responsible for premature failure and low breakdown voltages in ULSI devices. Therefore, it is unclear how hydride and chloride based precursor ALD solves this issue.

The issue of interface quality is typically not addressed, that is, the interfacial quality of bulk Si/high-k oxide. Typically, the interfacial quality and/or defect density is inferior to that of the $Si/SiO_2$ system and therefore FET channel and threshold voltage performance is compromised.

The important issue of electron confinement is understated in the pursuit of high-k gate dielectrics. Of central importance is the energy barrier presented to electrons and holes at the interface between two dissimilar semiconductors, namely, the gate oxide and bulk Si, hereafter referred to as a hetero-junction. The hetero-junction conduction band offset between the high-k oxide and bulk Si is typically less than the $SiO_2$/Si system. Therefore, thermionic emission of electrons across the potential barrier is greater in the Si/high-k heterojunction.

Regardless of the final ULSI implementation of high-k gate oxide(s), silicon-on-insulator (SOI) substrates are a key technology for high performance ULSI. To date, practical implementation of SOI substrates can be classed as the following forms, (i) a thin single crystalline silicon layer separated from the silicon bulk substrate by an amorphous $SiO_2$ layer, forming the insulator and (ii) a thin layer of re-crystallized or deposited Si onto a glass or wide bandgap substrate, such as sapphire. Both forms are required to exhibit: (i) high quality single crystal Si surface active layer; (ii) high uniformity and a low defect density active Si layer, and (iii) a high uniformity and low leakage insulator.

The first form of SOI conceptually consists of a thin silicon active layer upon a $SiO_2$ buried oxide (BOX) insulator layer substantially disposed across a bulk Si substrate. The BOX layer is typically formed using two fabrication methods. One method uses primarily high energy oxygen implantation through the surface of the silicon to an appropriate depth and profile, followed by an aggressive thermal anneal processes in order to recrystallize the surface damaged active Si layer to single crystal Si. This technique is known as the separation by implantation of oxygen process (SIMOX). Another method uses substantially wafer bonding of two separately oxidized silicon wafer surfaces that are brought into intimate contact and annealed to form a BOX layer. Once the two substrates have been joined, one of the silicon substrates in then physically reduced in thickness in a direction from one of the exterior silicon surfaces toward the BOX layer. This is achieved by chemical mechanical polishing (CMP) and or etching, or via physical abrasion down to the active Si layer thickness required. A variant on the wafer bonding approach is to use atomic layer cleaving, via hydrogen implantation of a buried defect layer. Upon annealing the hydrogen forms a preferential cleaving plane and a large portion of the sacrificial silicon substrate can be removed.

However, extensive CMP is still required to form a uniform flat active silicon layer surface. Both forms of SOI, however, share the unfavorable properties that the Si/buried oxide interface is highly defective and is not usable as a lower gate dielectric layer for FET devices. Secondly, both forms of SOI are presently costly to produce and it is this fact that hinders wider acceptance of SOI technology in present and future ULSI processes. Thirdly, conventional SOI fabrication technologies are time consuming and physically require many serial processing and cleaning steps. Fourthly, active Si layer thickness required for fully depleted SOI, typically less than or equal to 500 Angstroms, are extremely difficult to realize. Finally, the BOX thickness is required to be relatively thin.

To date general deposition techniques have been used to explore RE-oxide thin films on Si substrates. In one method, light rare earth metals, occurring at the beginning of the rare-earth sequence in the periodic table of elements, have been utilized. Light metal rare-earth oxides have been demonstrated by electron-beam evaporation (EBE) of a single stoichiometric RE-oxide target. The disadvantage of this technique is stoichiometry of the target does not ensure stoichiometry of the resulting deposited thin film oxide. Most notable prior art using EBE are $Y_2O_3$, $Pr_2O_3$ and $Gd_2O_3$ thin films.

$Y_2O_3$ and $Pr_2O_3$ have been deposited on silicon substrates and are predominately polycrystalline and or amorphous in nature when deposited on Si(001) oriented substrates. Single crystal thin films have not been demonstrated on Si(001)-oriented substrates.

A further disadvantage of this technique is that prolonged use of the single source EBE rare-earth oxide results in unfavorable rare-earth-to-oxygen ratio variation. Yet another disadvantage of this technique is the lack of evaporant flux control by virtue of the EBE process. Yet a further disadvantage of this technique is the introduction of charged species/defects that affect trapped oxide charge in an unfavorable manner. The later point is crucial to the performance of FET devices.

In a second method, the deposition of light rare-earth metal oxides is achieved using high vacuum environment deposition, unexcited molecular oxygen gas and EBE of elemental light rare-earths. An example of this method is found in U.S. Pat. No. 6,610,548, which describes a two source deposition technique using vacuum EBE of Cerium rare-earth source material and unexcited molecular oxygen gas. Disclosed are cerium dioxide $CeO_2$ rare earth oxide layers grown on Si substrates at growth temperatures ranging $100 < T_{growth} < 300$ deg C.

It has been known for well over a decade that clean (001)-oriented surfaces of Si and Ge exhibit 2×1 reconstructions. Using typical surface analysis tools in a suitable environment, (such as reflection high energy diffraction, i.e.: RHEED, and high vacuum conditions), two 2×1 reconstructions rotated by 90° are typically observed when the native $SiO_2$ oxide is removed. An ideal Si surface of a diamond lattice structure represents an non-terminated Si (001)-oriented surface. Each face Si atom will have two dangling bonds. The 2×1 reconstruction is due to a minimization of surface energy and a pairing of atoms in neighboring rows occurs, i.e., dimerization. Two orthogonally oriented 2×1 domains which are typically observed can be understood as dimers on terraces which are separated by single atomic layer steps of height equal to one quarter the bulk Si crystal lattice constant. RHEED diffraction patterns which show one 2.times.1 domain only, should then be observed in samples which exhibit ether (i) no steps or (ii) bi-layer steps of height equal to half the bulk Si lattice constant.

Single-domain Si(001) surfaces are easily obtained by preparing a Si surface which are intentionally misoriented from the ideal Si(001)-orientation. Typically, miscut substrates of approximately 1 to 6 degrees misoriented towards [110] can be used for this purpose.

U.S. Pat. No. 6,610,548 discloses the growth of amorphous and or polycrystalline growth of cerium dioxide on Si(001)-oriented substrates with a mixed 2.times.1 and 1.times.2 prepared surface. Following an oxide deposition is a high temperature anneal for recrystallization of the light rare-earth oxide, so that the crystal quality can be improved. The presence of initial amorphous silicon oxide and or amorphous cerium oxide initial layers in the growth sequence toward a final polycrystalline cerium oxide layer is completely different to the behavior observed in the present invention using technique 4, discussed later.

A major disadvantage of aforementioned techniques, as discussed in U.S. Pat. No. 6,610,458, is the limitation to the type of rare-earth oxide that can be used. Cubic structure crystallizations of rare-earth oxides of the formula REO.sub.2 are accessible, in general, to only the lighter rare-earth metals. The present invention teaches that beyond Ce, as the atomic number increases, most energetically favorable crystallizations are of the formula RE.sub.2O.sub.3. If fact, cubic rare-earth crystals will have significant net charge defect due to the multiplicity of rare-earth oxide oxidation state-thereby rendering such oxides inapplicable to high performance FET devices. Annealing such structures will result in mixed crystal phases, that is, polycrystallinity.

In a third method, a form of chemical vapor deposition is employed using molecular metal-organic precursors. Thin films of RE-oxides have been deposited on Si substrates by using a pyrolysis method. In this method thin organic films can be deposited using rare-earth metal which is attached to an acetylacetonate complex, namely RE(CH.sub.3COCHCOCH.sub.–0.3).sub.3H.sub.2O, and evaporated under medium vacuum conditions (>10.sup.–6 torr) in a tungsten crucible. The resultant films are similarly plagued by amorphous and or polycrystal RE-oxide phases. The same arguments outlined in the introduction of this paper, relating to precursor ALD process, also holds for this metal-organic deposition technique.

Erbium oxide has been deposited on Si substrates using medium vacuum level electron-beam evaporation of a single Er.sub.2O.sub.3 target material and high pressure metalorganic chemical vapor deposition (MOCVD) using a precursor of tris(2,4-pentadionato) (1,100-phenanthroline) erbium (III) [Er(pd).sub.3.Phen. The deposited thin film material quality in both of the above growth methods, namely EBE and MOCVD, exhibited amorphous phases of erbium oxide and at best poorly polycrystalline material. Single crystal erbium-oxide films has not been demonstrated and or claimed as beneficial in prior art. Similarly, single crystal rare-earth oxide and silicon multilayers have not been demonstrated.

In summary, using EBE of a chemically stoichiometric rare-earth oxide single target or rare-earth organic precursor, in general, does not ensure the correct deposited film stoichiometry. This results in amorphous and or polycrystalline rare-earth oxide thin film. Departure from stoichiometry in the film deposition structure results generally in strongly disordered structures.

Accordingly, there is a need for improved silicon-on-insulator (SOI) compositions, devices and applications. There is a further need for substantially single crystal SOI compositions, devices and applications.

SUMMARY OF THE INVENTION

An object of the present invention is to provide improved silicon-on-insulator (SOI) compositions, devices and applications.

Another object of the present invention is to provide substantially single crystal SOI compositions, devices and applications.

A further object of the present invention is to provide substantially single-crystal rare-earth oxides, rare-earth nitrides and rare-earth phosphides.

Yet another object of the present invention is to provide substantially single-crystal rare-earth oxides, rare-earth nitrides and rare-earth phosphides that are formed on silicon, germanium or silicon-germanium (SiGe) wafers.

Another object of the present invention is to provide high quality, single-crystal silicon over substantially single-crystal rare-earth oxides, rare-earth nitrides and rare-earth phosphides structures.

Still another object of the present invention is to epitaxially grow high-quality silicon on insulator wafers, with crystalline quality exceeding those currently available.

A further object of the present invention is to create substrate materials used in the manufacture of integrated circuits that contain multifunction circuit elements that, if grown on conventional substrates, would otherwise not be possible.

Yet another object of the present invention is to provide crystalline wide band gap rare-earth oxide or nitride or phosphide materials in low dimensional confinement high electron or hole mobility transistors.

Still another object of the present invention is to provide multi-layer crystalline Si onto thick and thin films of single crystal erbium oxide.

Still another object of the present invention is to provide multi-layer thick and thin film constructions consisting of crystalline Si and single crystal erbium oxide.

Yet another disclosure of the present invention is to provide epitaxial deposition of rare-earth nitrides and rare-earth phosphides binary semiconductors formed by epitaxial deposition.

Yet another object of the present invention is to provide multi-layer crystalline Si onto thick and thin films of single crystal rare-earth oxide and or rare-earth nitride and or rare-earth phoshide.

Yet another object of the present invention is to provide multi-layer thick and thin film constructions consisting of crystalline silicon and single crystal rare-earth oxide and or rare-earth nitride and or rare-earth phoshide.

Another object of the present invention is to provide compositions of the formula:

[RE].sub.x[O].sub.y, where x and y are positive real numbers, RE is at least one type of rare-earth metal atom, and a majority of the composition is a single crystal, as well as associated SOI's and other structures incorporating the compositions.

A further object of the present invention is provide binary single-crystal rare-earth nitride compositions of the formula: RE.sub.xN.sub.y where x and y are positive real numbers, RE is at least one type of rare-earth metal atom, and a majority of the binary rare-earth nitride is single crystal, as well as associated SOI's and other structures incorporating the compositions.

Yet another object of the present invention is provide binary single-crystal rare-earth phosphide compositions of the formula: RE$_x$P$_y$ where x and y are positive numbers, RE is at least one type of rare-earth metal atom, and a majority of the binary rare-earth phosphide is single crystal, as well as associated SOI's and other structures incorporating the compositions.

Still a further object of the present invention is to provide rare-earth oxy-nitride ternary compositions of the formula [RE]$_x$[O$_{1-z}$N$_z$]$_y$, where x, y and z are positive real numbers, RE is at least one type of rare-earth metal atom, and a majority of the composition is single crystal, as well as associated SOI's and other structures incorporating the compositions.

Still a further object of the present invention is provide rare-earth oxy-nitride ternary compositions of the formula [RE]$_x$[O$_{1-z}$N$_z$]$_y$, where x, y and z are positive real numbers, RE is at least one type of rare-earth metal atom, and a majority of the composition is either single crystal, polycrystalline or amorphous, as well as associated SOI's and other structures incorporating the compositions.

Another object of the present invention is provide silicon rare-earth oxide nitride, phosphide ternary and or quaternary alloy compositions of the formula:

[(RE)$_x$(O or N or P)$_y$] [Si or Ge or SiGe]$_z$, where RE is at least one type of rare-earth metal, where x, y and z are positive real numbers, and a majority of the composition is a single crystal.

These and other objects of the present invention are provided in a semiconductor-on-insulator structure that includes a substrate layer, a semiconductor layer and an insulator layer interposed between the substrate layer and the semiconductor layer. The insulator layer is a rare-earth oxide of the formula:

[RE]$_x$[O]$_y$, where x and y are real positive less than 5, RE is at least one type of rare-earth metal atom and a majority of the composition is a single crystal.

In another embodiment of the present invention, a semiconductor-on-insulator structure includes a substrate layer, a semiconductor layer and an insulator layer interposed between the substrate layer and the semiconductor layer. The insulator layer is a binary single-crystal rare-earth nitride of the formula:

RE$_x$N$_y$ where x and y are real positive numbers, RE is at least one type of rare-earth metal atom, and a majority of the binary rare-earth nitride is single crystal.

In another embodiment of the present invention, a semiconductor-on-insulator structure includes a substrate layer, a semiconductor layer and an insulator layer interposed between the substrate layer and the semiconductor layer. The insulator layer is a binary single-crystal rare-earth phosphide of the formula:

RE$_x$P$_y$ where x and y are real positive numbers less than or equal to 2, RE is at least one type of rare-earth metal atom, and a majority of the binary rare-earth phosphide is single crystal.

In another embodiment of the present invention, a semiconductor-on-insulator structure includes a substrate layer, a semiconductor layer and an insulator layer interposed between the substrate layer and the semiconductor layer. The insulator layer is a rare-earth oxy-nitride ternary of the formula:

[RE]$_x$[O$_{1-z}$N$_z$]$_y$, where x, y and z are real positive numbers, RE is at least one type of rare-earth metal atom, and a majority of the insulator layer is single crystal.

In another embodiment of the present invention, a semiconductor-on-insulator structure includes a substrate layer, a semiconductor layer and an insulator layer interposed between the substrate layer and the semiconductor layer. The insulator layer is a rare-earth oxy-nitride ternary of the formula:

[RE]$_x$[O$_{1-z}$N$_z$]$_y$, where x, y and z are real positive numbers less than or equal to 5, RE is at least one type of rare-earth metal atom, and a majority of the insulator layer is single crystal.

In another embodiment of the present invention, a semiconductor-on-insulator structure includes a substrate layer, a semiconductor layer and an insulator layer interposed between the substrate layer and the semiconductor layer. The insulator layer is a silicon rare-earth oxide, and or nitride, and or phosphide ternary and or quaternary alloy of the formula:

[(RE)$_x$(O and or N and or P)$_y$][Si or Ge or Si$_j$Ge$_{j-1}$]$_z$, where RE is at least one type of rare-earth metal, x, y, j and z are real positive numbers and a majority of the insulator layer is a single crystal.

In another embodiment of the present invention, a field effect transistor gate dielectric structure for an integrated circuit includes first and second dielectric layers. At least one of the layers is made of a rare-earth oxide of the formula:

[RE]$_x$[O]$_y$, where x and y are positive real numbers, RE is at least one type of rare-earth metal atom and a majority of the composition is a single crystal. A first semiconductor layer is positioned between the first and second dielectric layers.

DESCRIPTION OF THE EMBODIMENTS

Figure 1:
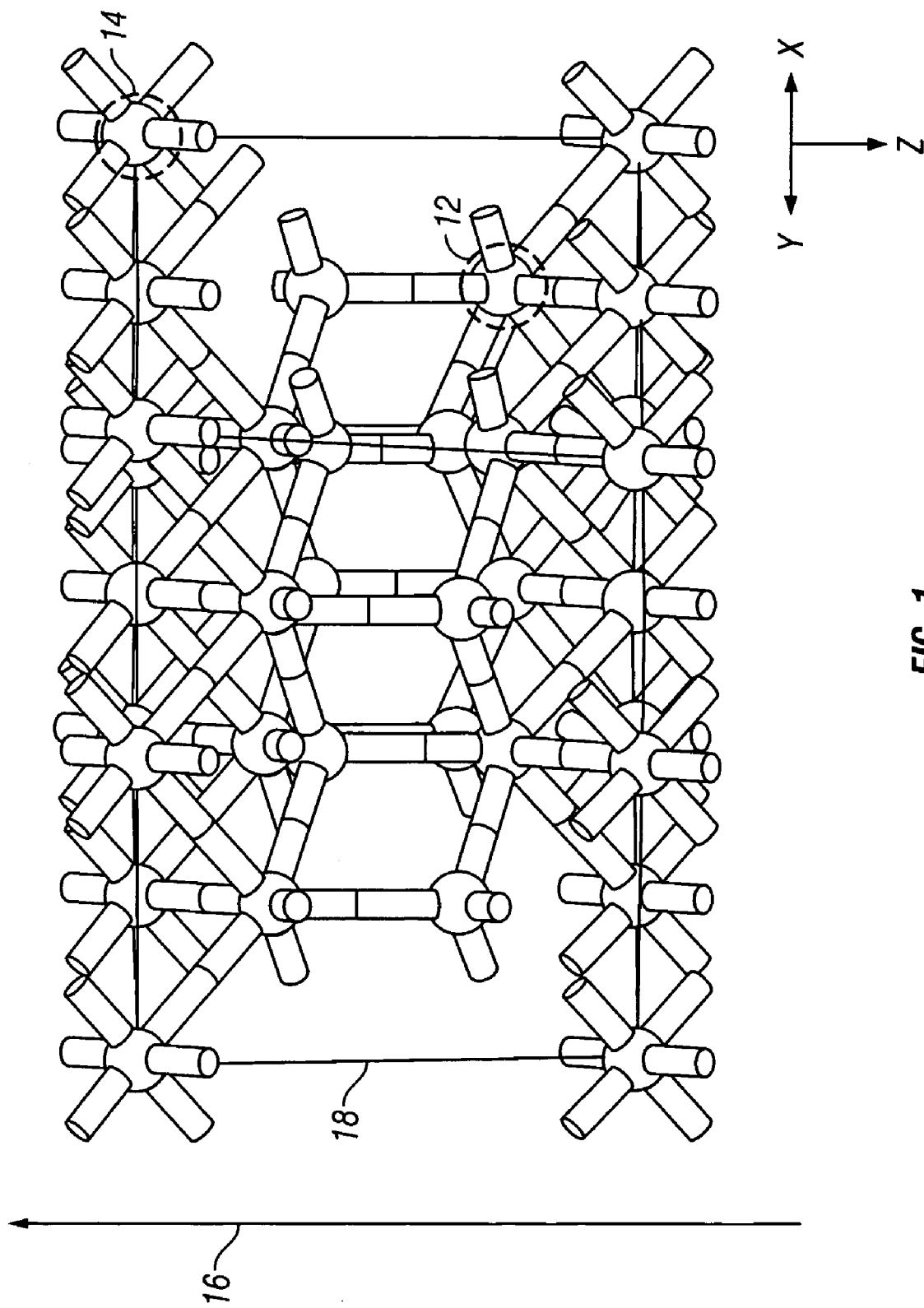
FIG. 1 illustrates one embodiment of a three dimensional atomic arrangement of a single crystal rare-earth oxide c-ErOx of the present invention.

In various embodiments, the present invention provides, (i) growth techniques, (ii) epitaxial process steps, (iii) substantially single crystal rare-earth oxide compositions and structures, (iv) ternary and or quaternary rare-earth oxide compounds with Si and or Ge, (v) the use of unexcited molecular oxygen, excited metastable molecular oxygen, atomic oxygen, isotopically pure oxygen or a combination of these forms of oxygen, (vi) activated nitrogen species, molecular and or atomic, (vii) rare-earth oxynitride, (viii) substantially single crystal, polycrystal and or amorphous rare-earth nitrides and phosphides, (ix) ternary and or quaternary rare-earth nitrides and phosphides with Si and or Ge, (x) tunable electronic and optical band gap rare-earth compounds, (xi) multilayer structures of rare-earth compounds, such as rare-earth oxides, rare-earth nitrides, rare-earth oxynitrides, rare-earth phosphides, or mixtures thereof with Si, Ge and SiGe, and Si, Ge or silicon-germanium alloys, (xii) material systems using any of the preceding for a variety of devices including but not limited to integrated electronic devices, passive photonic devices, electro-optical devices, magneto-optical devices, magneto-electronic devices, and the like.

In one embodiment of the present invention, predominately single crystal growth of rare-earth metal oxides can require separate control of the relative oxygen and elemental metal fluxes for optimal deposition. Oxygen rich conditions with elemental metal can be advantageous for single crystal erbium oxide deposition. Furthermore, the heavy rare-earths, such as erbium and ytterbium in particular, can be simply evaporated in elemental form using effusion cells and ceramic crucibles. A single RE-oxide EBE target or rare-earth precursor style MOCVD can require the supply of additional oxygen with unexcited molecular oxygen, excited molecular oxygen, or atomic oxygen, to provide that the growth conditions are oxygen rich or metal deficient conditions prevail, as more fully described hereafter.

In one embodiment of the present invention, planar dual gate field effect transistor structures are created using a multiple layer deposition cycle comprising silicon and RE-oxide or RE-nitride or RE-phosphide (or ternaries with Si or Ge). The basic cyclic unit is the epitaxial deposition of substantially single crystal or polycrystalline silicon onto a prior deposited high-k dielectric single crystal RE-oxides, RE-nitrides and RE-phosphides, or associated ternaries with Si or Ge onto substantially Si substrates.

In another embodiment of the present invention, planar dual gate field effect transistor structures are provided and can be created using a multiple layer deposition cycle of silicon and RE-oxide or RE-nitride or RE-phosphide, or ternaries with Si or Ge. The basic cyclic unit is the epitaxial deposition of substantially single crystal or polycrystalline silicon onto a prior deposited high-K dielectric single crystal RE-oxides, RE-nitrides and RE-phosphides, or associated ternaries with Si or Ge) onto substantially Si substrates, with a subsequent metal silicide gate contact that can be by way of illustration and without limitation, bulk erbium silicide, $SiEr_x$, a multilayer of silicon/$SiEr_x$, and the like, where x is a real positive number less than 2.

In one embodiment of the present invention, optically active structures are provided using one or multiple layer deposition cycles of silicon and RE-oxide, RE-nitride, RE-phosphide or ternaries with Si or Ge. The basic cyclic unit can be the epitaxial deposition of substantially single crystal or polycrystalline silicon onto a prior deposited high-K dielectric single crystal RE-oxides, RE-nitrides and RE-phosphides, or associated ternaries with Si or Ge, onto substantially Si substrates.

In one embodiment of the present invention, optically active structures are provided that can be electronically excited to emit optical radiation and or used for the conversion of optical radiation into electrons and or holes. This structure can employ one or multiple layer deposition cycles of silicon and RE-oxide, RE-nitride, RE-phosphide or ternaries with Si or Ge. The basic cyclic unit can be the epitaxial deposition of substantially single crystal or polycrystalline silicon onto a prior deposited high-K dielectric single crystal RE-oxides, RE-nitrides, RE-phosphides or associated ternaries with Si or Ge onto substantially Si substrates.

In another embodiment of the present invention, magnetically active structures are provided using one or multiple layer deposition cycles of silicon and RE-oxide, RE-nitride, RE-phosphide or ternaries with Si or Ge. The basic cyclic unit can be the epitaxial deposition of substantially single crystal or polycrystalline silicon onto a prior deposited high-K dielectric single crystal. RE-oxides, RE-nitrides, RE-phosphides or associated ternaries with Si or Ge, onto substantially Si substrates.

In one embodiment of the present invention, highly efficient optically pumped and or electro-optical devices are provided. In this embodiment, rare-earth metals are utilized as optically active elements, and the rare-earth atoms are in the triply ionized ($RE^{3+}$) state. If this condition is not met when the RE is introduced into a compound, the RE is not optically active to the first order. This is due to the unique electronic configuration of the 4f-shell of the rare earths. Therefore, optimal bonding co-ordination of the rare earth metal in oxide, nitride, phosphide or Si ternaries of the aforementioned compounds must result in a net removal of three electrons from the rare-earth metal, e.g., the rare earth being is in a triply ionized state.

Rare-earth oxides can have a multiplicity of phases. The lighter rare-earth metals can form compounds with oxidation states $RE^{+}$, $RE^{2+}$, $RE^{3+}$ and $RE^{4+}$, amongst others. Only, the $RE^{3+}$ state is optimal, and therefore compounds of the formula $RE^{+4}O_2^{2-}$, for example, are optically unremarkable. In various embodiments of the present invention, a heavy metal rare-earth oxide, by way of example using erbium oxide single crystal material, can be grown epitaxially on a multiplicity of Si substrates using the growth techniques described herein. Very strong optical activity of the lowest lying 4f-shell transition is indicative of predominately $RE^{3+}$ oxidation state in one embodiment of the present invention.

In one embodiment of the present invention, under suitable conditions, nitrogen forms strong RE—N bonds. The rare-earth nitride system has a very strong ionic character. In comparison to the rare-earth oxides, the rare-earth nitride and phosphide compounds can exhibit substantially higher probability of $RE^{3+}$ oxidation states. In one embodiment of the present invention, nitrogen and phosphorus atoms have a very high affinity for accepting three electrons when forming RE compounds. Anions with $N^{3-}$ and $P^{3-}$ states can form rare-earth nitride and rare-earth phosphide compounds of the formula $RE^{3+}N^{3-}$ or $RE^{3+}P^{3-}$. In contrast, the heavier rare-earth oxides preferentially form $RE^{3+}_2O^{2-}_3$ compounds.

In another embodiment of the present invention, rare-earth oxy-nitride (RE—O—N) or rare-earth oxy-phosphides (RE—O—P) compositions are provided that can be used to control the oxidation state of the rare-earth, and thereby control the electronic and optical properties of the material. By way of illustration, and without limitation, a single crystal and or polycrystal erbium nitride (ErN) material, ErP compositions and the like are provided.

In one embodiment of the present invention, rare-earth nitride ErN, rare-earth-phoshides, ErP binary compounds, and the like are provided and have a greater disposition to crystallize in substantially cubic and or wurtzite structures. This crystal symmetry group is well suited to preferential epitaxial growth on diamond like crystal structures such as the Si(001)-oriented surface, or related misoriented surfaces. In contrast the rare-earth oxide of substantially $RE_2O_3$ type crystal structure will have a greater disposition for crystallization on substantially hexagonal symmetry of the Si(111)-oriented surfaces.

In one embodiment of the present invention, selective nitridation (i.e.,: selectively introducing a nitrogen species) or phosphorization (i.e.,: selective introduction of a phosphorus species) of a substantially rare-earth oxide compound can be used to modify the charge state of the anion and cations of the initial compound. The reverse case also holds true, that of selective oxidation of a substantially pure rare-earth nitride or rare-earth phosphide compound. In this embodiment, a higher (lower) anion charge $N^{3-}(O^{2-})$ can occur by gradual substitution of oxygen (nitrogen) in a rare-earth oxide (nitride) compound. For the rare-earth metals there are associated charge compensation requirements. The anion charge compensation can be efficiently compensated by the addition of another species, including but not limited to, Si, Ge and the like. By way of illustration, and without limitation, a rare-earth ternary in the case of rare-earth oxide can use introduction of $2N^{3-}$ that replaces $3O^{2-}$. For example, the nitridation transition from $RE_2O_3$ toward REN, requires the removal on average of 1.5 oxygen atoms for the insertion of each nitrogen atom in order for charge neutrality to be conserved.

In one embodiment of the present invention, the above anion substitution process is capable of altering the electronic band gap, electrical conductivity type, that is, hole p-type or electron n-type excess (character) and optical properties such as absorption and emission characteristics. The excess electrical charge characteristics of this process can be advantageously used in the construction of high electron and or hole mobility transistors and or for the manipulation of the quasi fermi-level of the material.

In another embodiment of the present invention, highly efficient tunable bandgap electronic and/or electro-optical devices are provided. In this embodiment, quantum confinement structures are provided using periodic and non-periodic multiplayer hetero-structures, as well as with the selective ionization state of the rare-earth species. Band gap engineered compounds and or the 4f-shell electronic transitions of the triply ionized rare-earth ions in the respective compounds are provided.

In one embodiment of the present invention, highly efficient tunable optical gain materials are provided based on the rare-earth 4f-shell electronic transitions. The emission and absorption characteristics are relatively temperature independent compared to optical gain materials composed of group III-V and or III-nitride semiconductors.

In another embodiment of the present invention, highly efficient tunable optical gain materials are provided. These can be based on the intersubband and intrasubband electronic transitions engineered by quantum well potentials generated by periodic or non-periodic structures of wide band gap rare-earth oxide, rare-earth nitride, rare-earth phosphide and smaller band gap silicon and or germanium, and the like. Additionally, highly efficient tunable refractive index optical and or electro-optical devices are provided and can be with cladding layers, optical core layers and optically active layers for passive and/or active waveguides or cavities. The control of refractive index is important in guiding optical radiation in directions substantially planar and or vertical directions to the layer growth direction.

In one embodiment of the present invention, multilayer constructions of rare-earth oxides, rare-earth nitrides, rare-earth phosphides and silicon are provided for the creation of a variety of devices. Such devices include, but are not limited to, electronic field effect transistors, bipolar transistors, double or indeed multi gate FET transistors, vertical integration of multi FET layer circuits, and the like. In one embodiment of the present invention, highly efficient magneto-optical, electromagnetically, and piezo-electrically driven devices are provided. For example, paramagnetic and/or ferromagnetic and/or ferrimagnetic devices are provided, based on the magnetic properties of the triply ionized rare-earth ions which form the host rare-earth-oxide or rare-earth nitride or rare-earth phosphide active layer or multilayers, and can further be controlled using electronic and or and or piezoelectric and or optical excitations or de-excitations.

In one embodiment of the present invention, is the integration of a rare-earth quantum state prepared using the 4f-shell electronic energy manifold, that are controllable in character either/and optically and or electronically and or magnetically, and yet further each said dressed quantum state imbedded in a photonic band gap structure, which is capable of inhibiting or allowing optical coupling of the said dressed rare-earth quantum state. A functional quantum state as described above is the basic element or register of a quantum mechanical computing engine. Many such registers can be integrated using conventional silicon processing techniques. This potentially solves a long standing problem in the field of quantum computing.

In one embodiment of the present invention, substantially single-crystal rare-earth oxides (c-ErOx) are provided. In this embodiment, erbium ions are suitably activated in the triply ionized state, and optical absorption and emission of the 4f-shell manifold is possible. Erbium oxidizes and nitrides readily in a suitably activated atomic oxygen/nitrogen, metastable molecular oxygen/nitrogen and/or oxynitride environment. The present invention includes new forms of c-ErOx and c-ErN that can be epitaxially formed on a silicon substrate, in single crystal form.

EXAMPLE 1

One structure for the epitaxial c-ErOx, representing the single crystal composition $Er_xO_y$, is shown in FIG. 1, where x and y are real positive numbers. In FIG. 1, the c-ErOx structure is a construction of a supercell with periodic boundary conditions and is generally denoted as 10. The rare-earth atoms are represented as dark spheres 12 and the lighter spheres represent oxygen atoms 14. The layer-by-layer growth direction 16 is co-incident with the crystal growth direction. A portion of one complete two-dimensional oxygen terminated layer is shown as 18.

Figure 2B:
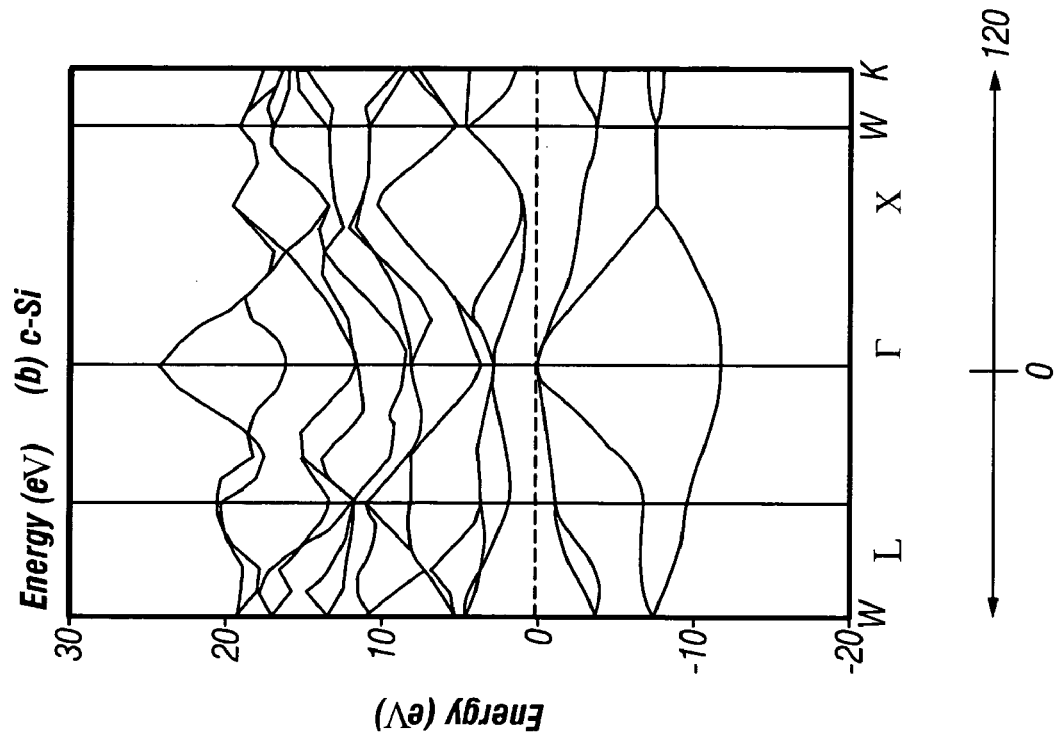
FIG. 2(b) illustrates a single crystal bulk silicon semiconductor E-k dispersion.
Figure 2A:
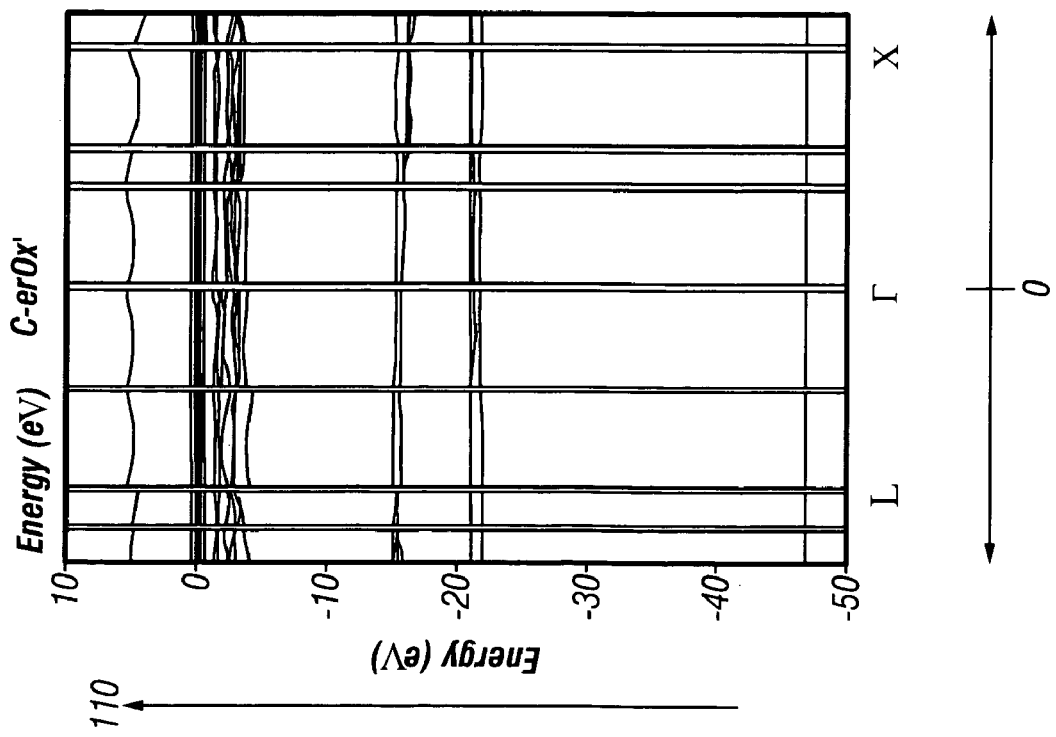
FIG. 2(a) illustrates energy E 110 dispersion as a function of crystal momentum k 120 of one embodiment of a single crystal rare-earth oxide Er$_x$O$_y$, of the present invention.

Using a density functional theory plane-wave psuedopotential method and self-consistent minimization, an energy-momentum calculation is performed. FIG. 2(*a*) illustrates energy E, denoted as 110, dispersion as a function of crystal momentum k, denoted as 120 of the single crystal rare-earth oxide $Er_xO_y$, of the present invention.

For comparison a bulk Si E-k curve is computed and shown in FIG. 2(*b*) c-ErOx has a quantitatively different band structure to that of bulk Si, primarily due to the type atomic symmetry and bonding. The band gap of c-ErOx is about 6 eV and has a refractive index much lower than that of Si, and can be about 1.7.

In one embodiment of the present invention, substantially single crystal erbium oxide compositions, their methods of formation and devices incorporating the compositions, are provided, as further described hereafter.

EXAMPLE 2

In one embodiment of the present invention, compositions are provided where nitrogen atoms with a very high affinity for accepting three electrons when forming RE compounds. That is, anions with $N^{3-}$ electronic states can form single crystal, polycrystal and amorphous rare-earth nitride compounds of the formula $RE^{3+}N^{3-}$. Conditions suitable for preparation RE—N compounds are for example using UHV environment suitable for deposition onto a substrate, an elemental RE source and source of atomic nitrogen (N) and or metastable excited molecular nitrogen ($N_2^*$) and or unexcited molecular nitrogen gas ($N_2$).

Rare-earth nitride ErN binary compounds can have a greater disposition to crystallize in substantially cubic and or wurtzite structures. This crystal symmetry group is well suited to preferential epitaxial growth on diamond like crystal structures such as the Si(001)-oriented surface, or related misoriented surfaces. In one specific embodiment of the present invention, RE—N compounds are provided that alloy with other elemental atoms. By way of example, and without limitation, alloying RE—N with silicon and or germanium forms ternary compounds of the formula $RE_xN_ySi_z$ and or $RE_xN_yGe_z$ The ternary compounds have variable lattice constants and electronic band gaps as a function of relative mole fraction, z, of Si and Ge.

EXAMPLE 3

In one embodiment, substantially single crystal, rare-earth phosphide compositions are provided. Under suitable conditions phosphorous forms strong ionic RE—P bonds. The phosphorous atoms or molecules have a very high affinity for accepting three electrons when forming RE compounds. That is, anions with $P^{3-}$ electronic states can form single crystal, polycrystal and amorphous rare-earth phosphide compounds of the formula $RE^{3+}P^{3-}$. Conditions suitable for preparation RE—P compounds are, for example, using UHV environment suitable for deposition onto a substrate, an elemental RE source, a source of atomic phosphorous (P), molecular phosphorous ($P_2$ and or $P_4$), sublimation of phosphide compounds, and the like.

Rare-earth nitride ErP binary compounds can have a greater disposition to crystallize in substantially cubic and or wurtzite structures. This crystal symmetry group is well suited to preferential epitaxial growth on diamond like crystal structures such as the Si(001)-oriented surface, or related misoriented surfaces.

RE—P compounds can be alloyed with other elemental atoms. By way of illustration, and without limitation, RE—P can be alloyed with silicon and or germanium to form ternary compounds of the formula:

$RE_xP_ySi_z$, and or $RE_xN_yGe_z$ where x, y and z are real positive numbers.

The ternary compounds can have a variable lattice constant and electronic band gap as a function of relative mole fractions, z, of Si and or Ge.

EXAMPLE 4

In this example, multi rare-earth oxide, nitride, phosphide binaries are provided. Multiple rare-earth metals can be incorporated into oxide, nitride and or phosphide based compounds. By way of illustration, and without limitation, $RE_1$=Er and $RE_2$=Yb can be co-deposited to form compounds of the chemical formula:

$[Er_zYb_{1-z}]_x[O \text{ or } N \text{ or } P]_y$, where z is the relative fraction of Er and Yb. This technique can be extended to several REs to form $[RE_1, RE_2, \ldots RE_3]_x[O \text{ or } N \text{ or } P]_y$, where x and y are real positive numbers. The spatial and chemical composition can be varied as a function of growth direction.

EXAMPLE 5

In this example, rare-earth oxynitride compounds can be formed by introducing oxygen and or nitrogen and or nitrous oxide ($N_2O$ or NO) species during deposition. Compounds exhibiting the chemical formula substantially of the formula:

$[RE]_x[O_{1-z}N_z]_y$ can form either unique single crystal or polycrystal or amorphous structures.

EXAMPLE 6

In this example, rare-earth oxide, nitride and or phosphide can be alloyed with other elements including but not limited to, group IV non-metals, such as Si and or Ge. Compositions exhibiting the chemical formula:

$[(RE)_x(O \text{ or } N \text{ or } P)_y][Si \text{ or } Ge \text{ or } SiGe]_z$ are provided using the above techniques for RE—[O, N, P] deposition and further co-deposition using elemental sources of Si and or Ge. For example, the introduction of elemental Si and Ge can be used to manipulate the electronic and structural properties of the compound. Another example is the co-deposition using silane ($SiH_2$) or germane ($GeH_2$) gaseous precursors during deposition. Yet another example is the post growth of Si and or Ge onto the said RE oxide, nitride or phosphide followed by annealing to form the ternary. In one embodiment of the present invention the spatial and chemical composition can be varied as a function of growth direction. Specific crystal structures, isomorphs, electronic band structure, magnetic and optical properties can be achieved by varying the relative chemical ratio of the constituents of the composition. Specifically, the lattice constant and or electronic nature of the composition can be advantageously varied to allow low defect density single crystal deposition onto dissimilar materials. The electronic properties of the composition can be advantageously varied from substantially insulating to semiconducting by introducing greater amounts of Si and Ge. The electronic nature of the composition can be further manipulated to exhibiting conducting behavior by introducing greater amounts of rare-earth ions and or using charge compensation methods as described above.

EXAMPLE 7

This example illustrates that in one embodiment of the present invention, the highest quality of substantially single crystalline structures of the present invention are grown when a so-called "template growth" process is employed. In this process, a layer of material of at least one type of rare-earth (RE), rare-earth oxide ($RE_xO_y$), rare-earth nitride ($RE_xN_y$), rare-earth phosphide ($RE_xP_y$); silicides formed by silicon (or germanium, or SiGe) alloyed with rare-earth ($RE_x(Si,Ge)_y$), rare-earth OxyNitride ($RE_x(O,N)_y$), or rare-earth OxyPhosphide ($RE_x(O,P)_y$); silicon nitride ($Si_xN_y$); silicon oxide ($SiO_y$); germanium oxide ($GeO_y$); germanium nitride $Ge_xN_y$; germanium phosphide ($Ge_xP_y$); elemental Si and or Ge; is used as a template upon which the compositions of the present invention grown. For example, in the growth of c-ErOx, optimal growth can be achieved using a pure-crystal Erbium template 220 grown over a single crystalline silicon oxide layer c-SiOx 218, where x is less than 1, as shown in FIG. 3(a).

Figure 3A:
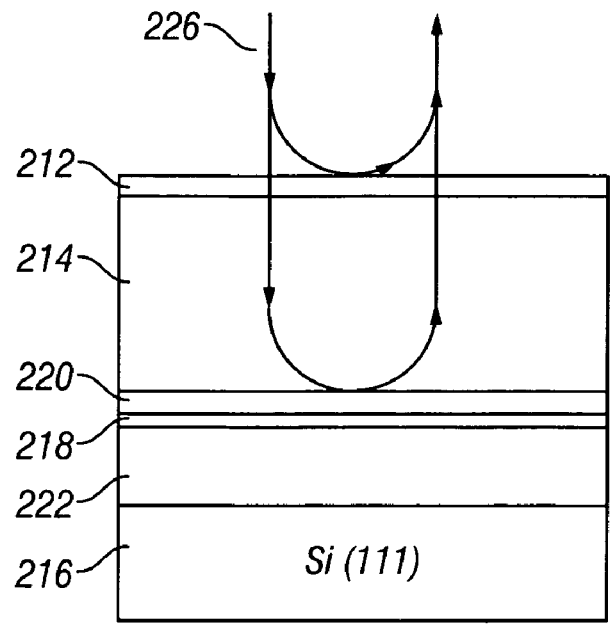
FIG. 3(a) illustrates one embodiment of a silicon on insulator structure 210 of the present invention.

FIG. 3(a) illustrates one embodiment of a silicon-on-insulator structure 210 of the present invention. A single crystalline silicon layer 212 is epitaxially deposited onto a single crystal ($Er_xO_y$) layer 214. Layers 212 and 214 are grown on a silicon (111)-oriented substrate, denoted as 216. Substantially pure-crystal template layers 218 and 220 are grown over a substantially single crystalline silicon buffer layer 222, for one embodiment of the present invention. Normally incident and reflected optical radiation 226 is used to monitor the multilayer stack as a function of deposition time.

Figure 3B:
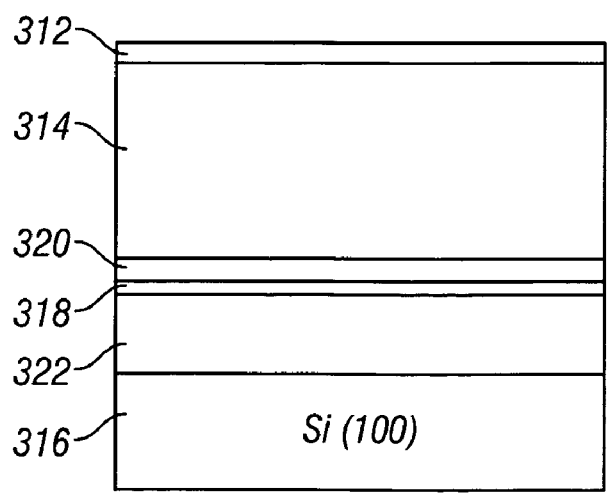
FIG. 3(b) illustrates another embodiment of a silicon on insulator structure of the present invention 310.

FIG. 3(b) illustrates another embodiment of a silicon-on-insulator structure 310 of the present invention. In this embodiment, a substantially single crystalline silicon layer 312 epitaxially deposited onto a single crystal ($Er_xO_y$) layer 314. Layers 312 and 314 are grown on a silicon (100)-oriented substrate 316. Pure-crystal template layers 318 and 320 are grown over a single crystalline silicon buffer layer 322, for one embodiment of the present invention.

It will be appreciated that a number of templates can be used, including but not limited to, $Si_{1-z}(Er_xO_y)_z$, (where x, y and z are real positive numbers) grown over a rare-earth Silicide ($SiEr_v$ where v is a real positive number less than 2), as shown in FIG. 3(b).

Figure 4:
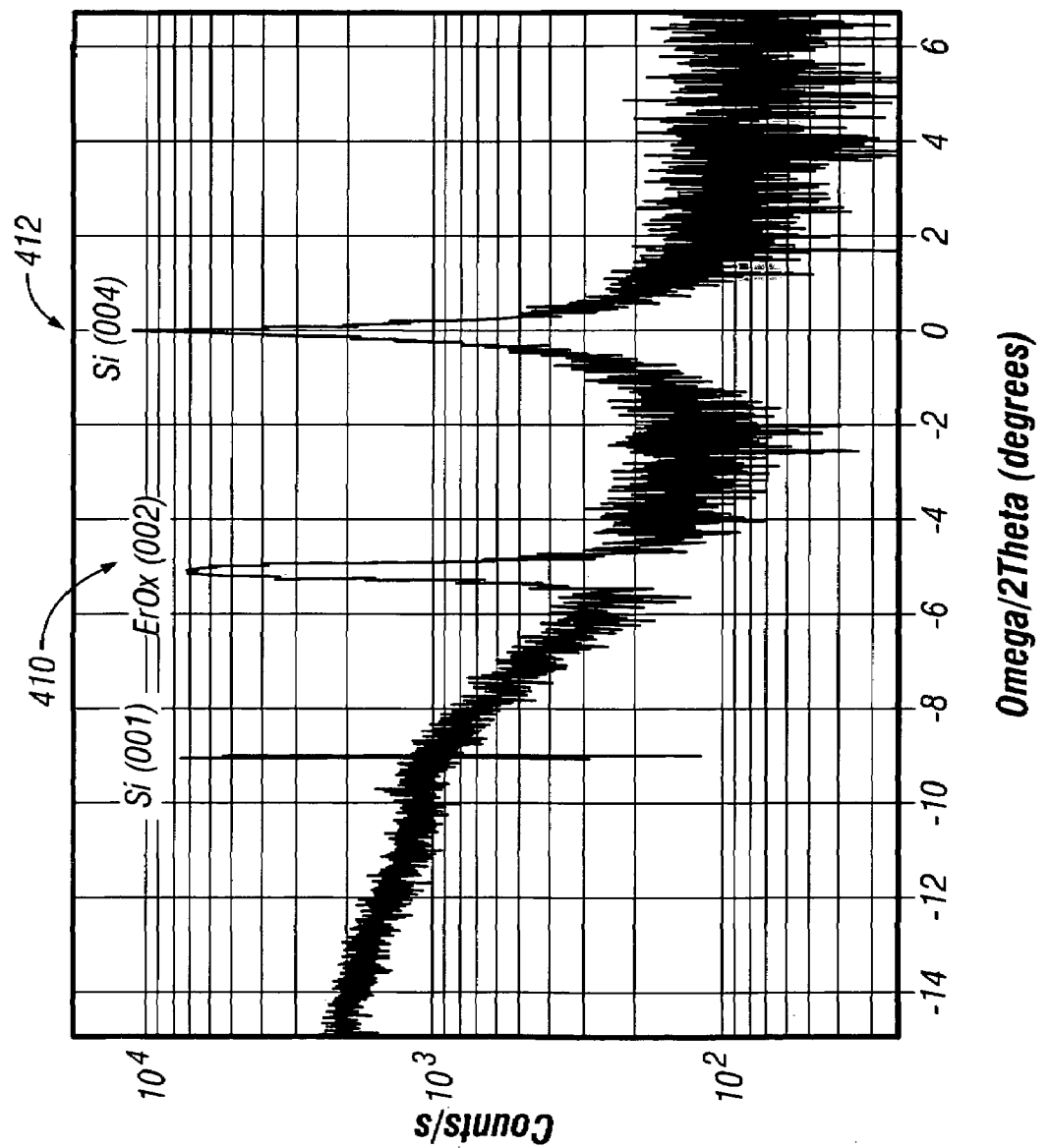
FIG. 4 illustrates the double crystal x-ray diffraction curve of the silicon-on-insulator structure disclosed in FIG. 3(b).

FIG. 4 illustrates the double crystal x-ray diffraction curve of the silicon-on-insulator structure disclosed in FIG. 3(b). The peak labeled 412 represents the single crystal silicon 004 reflection and the well defined narrow peak 410 represents the high quality single crystal erbium oxide 002 reflection. The absence of any other erbium oxide related peaks indicates the erbium oxide layer is isomorphic and single crystal.

Figure 5A:
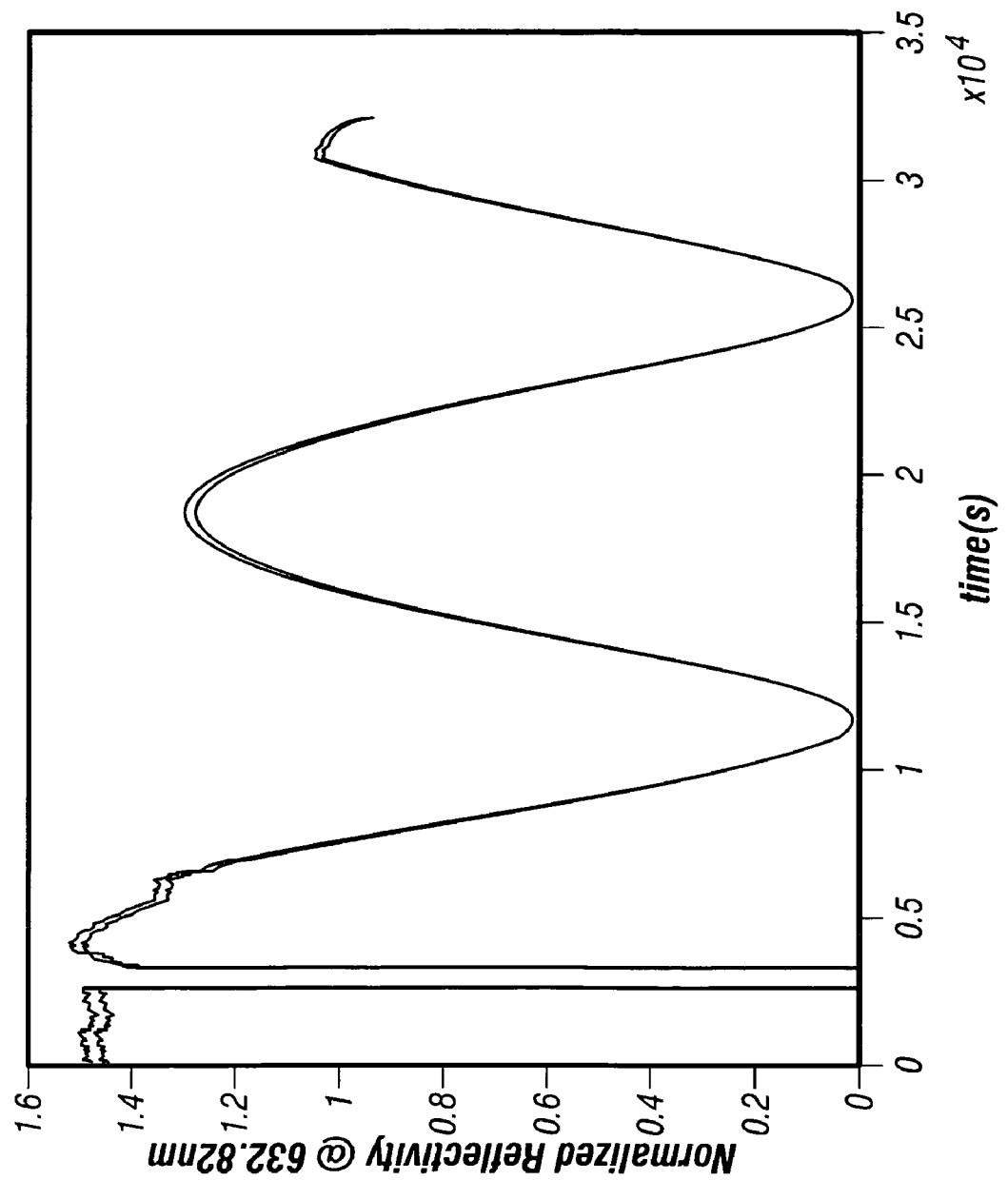
FIG. 5(a) illustrates the in-situ optical reflectance curve as a function of deposition time for a single crystal erbium oxide layer for the FIG. 3(a) structure.

FIG. 5(a) illustrates the in-situ optical reflectance curve as a function of deposition time for a single crystal erbium oxide layer. A monochromatic light source is used in the configuration disclosed in FIG. 3(a). The oscillations describe a growing surface with thickness increasing as a function of deposition time. Peaks indicate constructive interference and valleys indicate destructive interference.

Figure 5B:
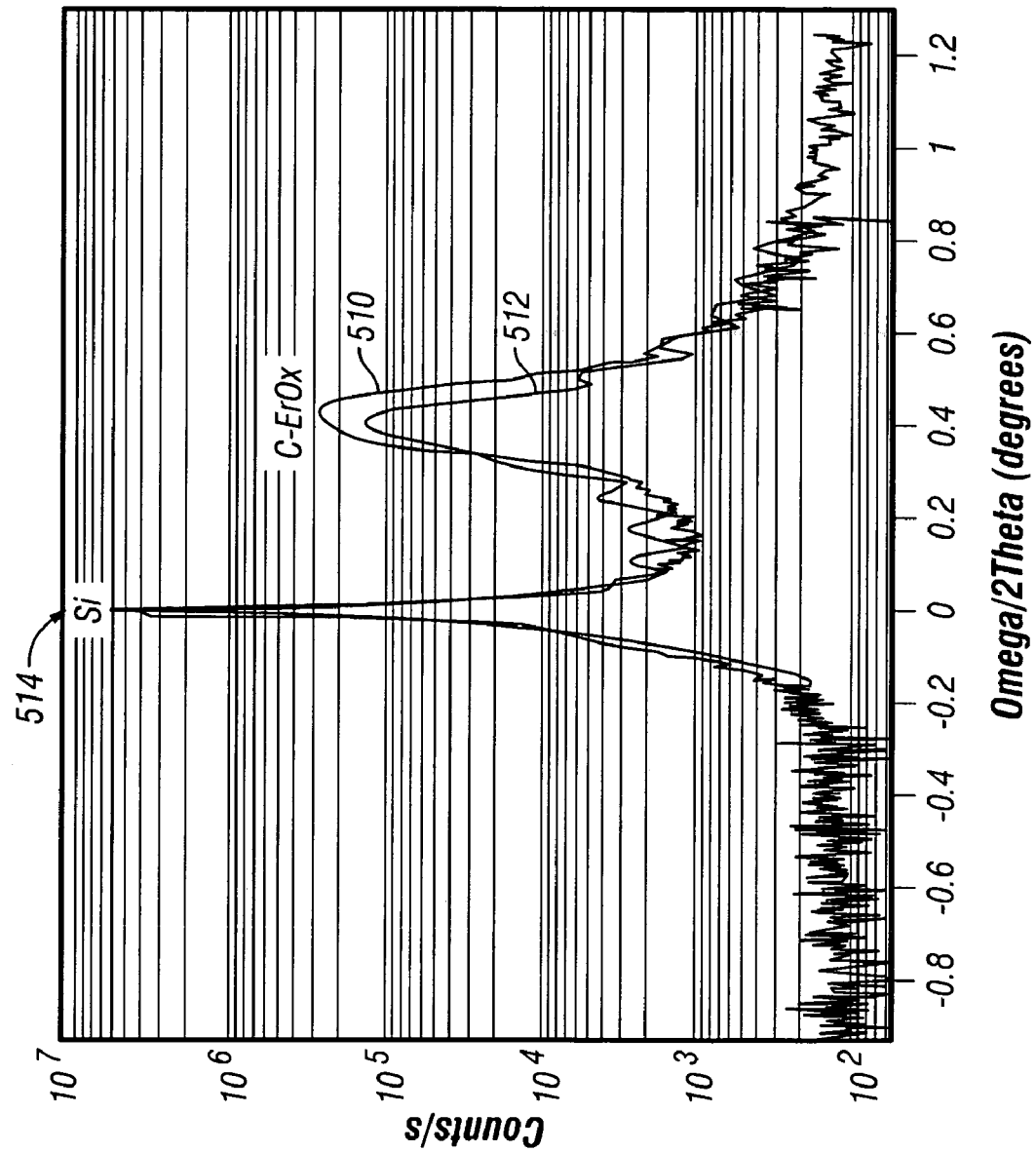
FIG. 5(b) illustrates the double crystal x-ray diffraction curve of the silicon-on-insulator structure disclosed in FIG. 3(a).

FIG. 5(b) illustrates the double crystal x-ray diffraction curve of the silicon-on-insulator structure disclosed in FIG. 3(a). Curves 510 and 512 indicate a high quality single crystal erbium oxide layer has been epitaxially deposited on to a silicon substrate. Curve 510 represents a silicon-on-insulator structure with thicker single crystal erbium oxide layer beneath the top single crystal silicon layer than curve 512. The single crystal silicon peak is shown as 514.

Figure 5C:
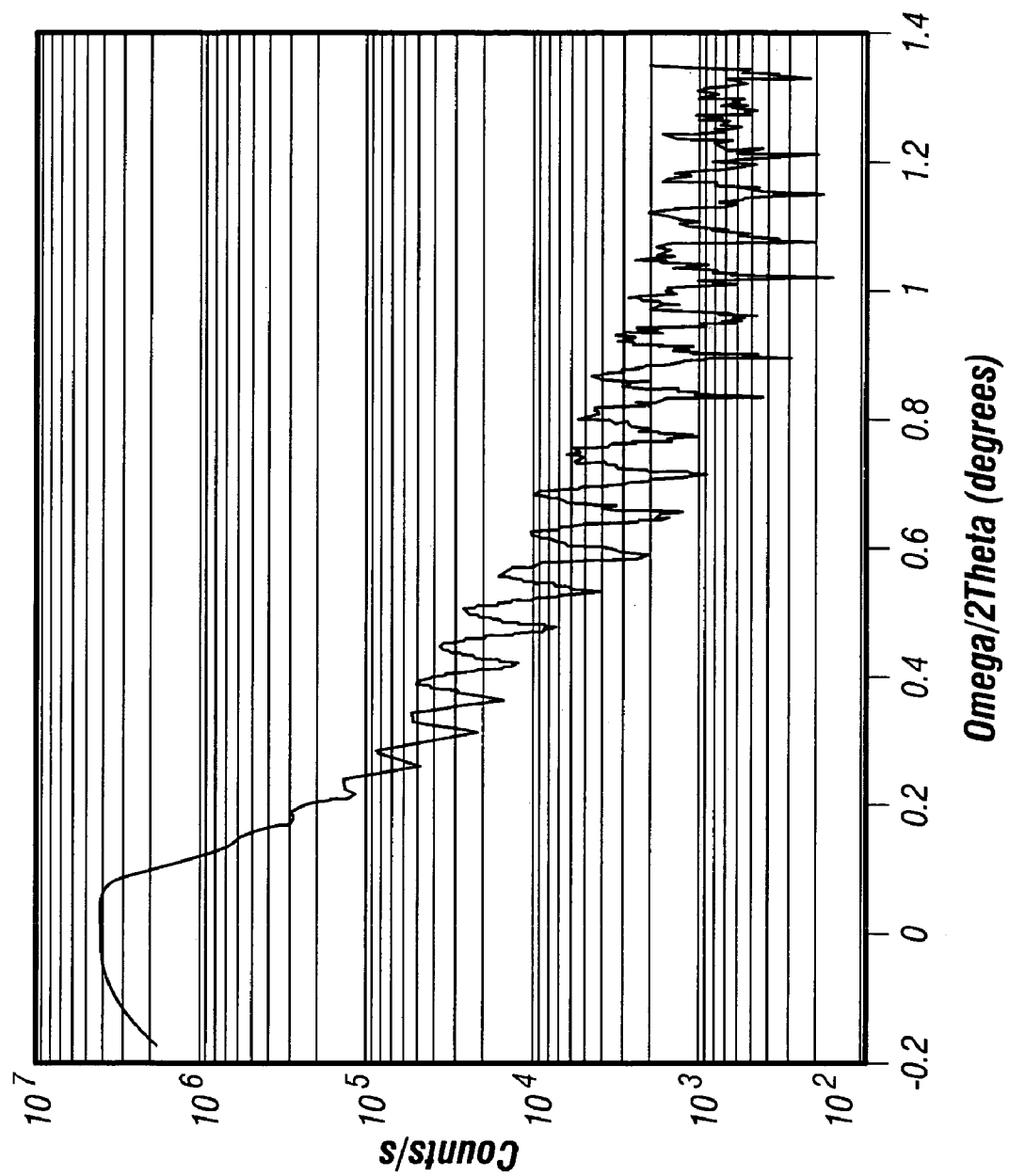
FIG. 5(c) illustrates the glancing incidence x-ray diffraction pattern of the structure disclosed in FIG. 3(a).

FIG. 5(c) illustrates the glancing incidence x-ray diffraction pattern of the structure disclosed in FIG. 3(a). The ripples as a function of angle indicate an atomically flat structure.

Figure 6:
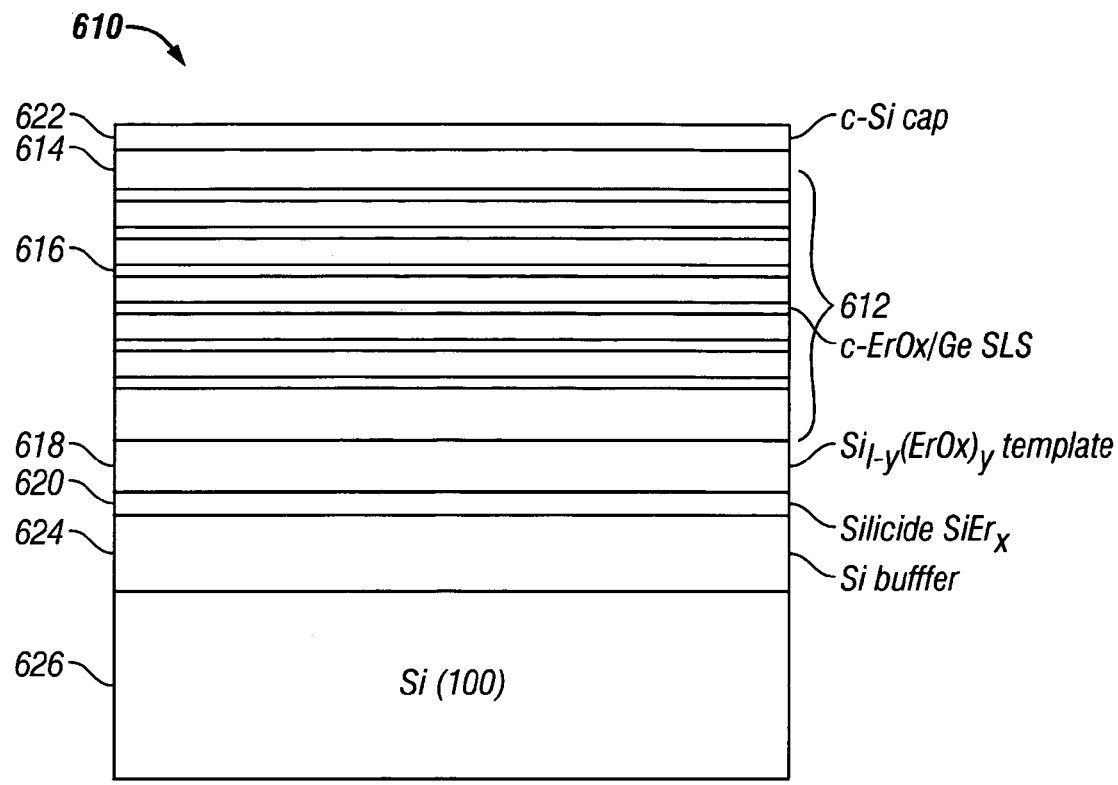
FIG. 6 illustrates one embodiment of a silicon-on-insulator structure of the present invention using a superlattice.

Sophisticated structures such as superlattices can be grown, and significantly enhanced using this template growth technique. FIG. 6 illustrates one embodiment of a silicon-on-insulator structure 610 of the present invention using a superlattice. Structure 610 includes a multilayer, superlattice structure 612 composed of crystalline erbium oxide 614 and germanium layer 616 constructions.

The lattice constants of the erbium oxide 614 and germanium 616 are substantially different. Single crystal defect free multi-layers are formed by balancing the tetragonal distortion of the epitaxially deposited films. The superlattice layer thicknesses are chosen so that equal and opposite strain forces in each layer substantially cancel resulting in a reduced strain or strain free superlattice 612. This allows a single crystal superlattice structure of total thickness substantially larger than the critical layer thickness of pure Ge to be deposited directly onto Si.

The superlattice structure 612 is grown on a silicon erbium oxide template layer 618 and an erbium silicide template layer 620 of one embodiment of the present invention. A single crystal silicon cap layer 622 is deposited over the superlattice structure 612. The multilayers are grown on a silicon buffer layer 624 which is deposited on a silicon (100)-oriented substrate 626.

In various embodiments, the superlattices of the present invention can have a substrate and a plurality of repeating units, at least a portion of the repeating units being at least one of:

1. a rare-earth oxide of the formula: ($RE_xO_y$), where x and y are real positive numbers less than or equal to 3;

2. a rare-earth nitride of the formula: ($RE_xN_y$) where x and y are real positive numbers less than or equal to 2;

3. a rare-earth phosphide of the formula: ($RE_xP_y$) where x and y are real positive numbers less than or equal to 2;

4. a rare-earth silicide of the formula: ($RE_xSi_y$), where x and y are real positive numbers less than or equal to 2;

5. a rare-earth oxynitride of the formula: ($RE_x[O_zN_{1-z}]_y$, where x and y are individually real positive numbers less than or equal to 3 and z is a real positive number less than or equal to 1;

6. a rare-earth oxyphoshide of the formula: ($RE_x[O_zP_{-1-z}]_y$) where x and y are individually real positive numbers less than or equal to 3 and z is a real positive number less than or equal to 1;

7. a rare-earth germanium alloy of the formula, ($RE_xGe_y$) where x and y are real positive numbers less than or equal to 3;

8. a rare-earth-germnium-oxide-nitride-phosphide of the formula: ($RE_x[O$ or $N$ or $P]_yGe_z$), where x, y and z are real positive numbers less than or equal to 3;

9. a germanium nitride of the formula: ($Ge_xN_y$) where x and y are real positive numbers less than or equal to 5;

10. a germanium oxide of the formula: ($Ge_xO_y$) where x and y are real positive numbers less than or equal to 3; and 11. a rare-earth-silicon-oxide-nitride-phosphide of the formula: (RE$_x$[O or N or P]$_y$Si$_z$), where x, y and z are real positive numbers less than or equal to 3.

12. a silicon nitride of the formula: (Si$_x$N$_y$), where x and y are real positive numbers less than or equal to 5.

13. a silicon oxide of the formula: (Si$_x$O$_y$), where x and y are real positive numbers less than or equal to 2.

Figure 7:
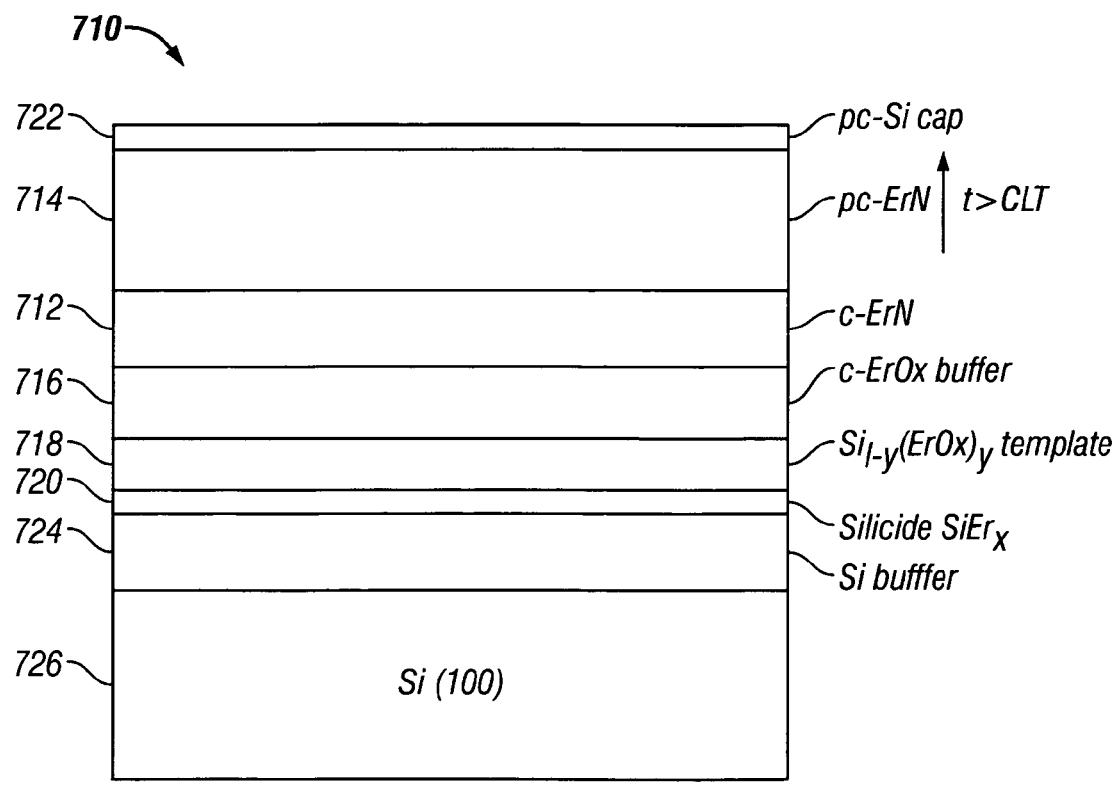
FIG. 7 illustrates another embodiment of the present invention using a template growth method as applied to growth of single crystal 712 and polycrystalline 714 erbium nitride (ErN).

This template growth method is also employed to grow materials with a controlled and highly specific ratio of crystalline to polycrystalline structure. The template growth method of this Example 7 can be used to create a continuous transition between pure single-crystalline structure through polycrystalline and finally to amorphous structure all in a single growth run. FIG. 7 shows this template growth method, as applied to erbium nitride growth with a Si$_{1-z}$(Er$_x$O$_y$)$_z$ template, where x, y and z are real positive numbers, for another silicon-on-insulator structure 710 of the present invention. In FIG. 7 substantially single crystal structure 712 and polycrystalline erbium nitride (ErN) 714 are provided. The erbium nitride layers were deposited on to a single crystal erbium oxide buffer layer 716. The erbium oxide buffer layer 716 was deposited on template layers composed of single crystal silicon erbium oxide 718 and erbium silicide 720. A top most silicon layer 722 was used to terminate the multilayer sequence. The multilayer structure was deposited on a silicon buffer layer 724 which is deposited on a silicon (100)-oriented substrate 726.

The single crystal ErN layer 712 has a different lattice constant to the single crystal erbium oxide buffer layer 716. As the ErN layer 712 increases in thickness beyond the critical layer thickness (CLT), misfit dislocations occur and polycrystalline ErN (pc-ErN) 714 occurs. The transition from single crystal to polycrystalline ErN growth is depicted to occur at the region between 716 and 712. Furthermore, the polycrystalline silicon cap layer 722 can be deposited over the polycrystalline ErN layer 714. It should be noted that if the CLT is not exceeded for ErN growth on single crystal erbium oxide, then single crystal ErN can be obtained. It is therefore possible for single crystal silicon to be deposited on the single crystal ErN layer 712. The single crystal silicon layer can be advantageously grown to be in a state of tension and or compression. That is, strained layer silicon can be formed, thereby comprising a strained SOI structure. In one embodiment of the present invention, a single crystal ErN can be epitaxially deposited directly on top of Si(001)-oriented surfaces with and without miscut oriented surfaces upto six degrees.

EXAMPLE 8

This example discusses various growth tools that can be utilized with the compositions, and devices of the present invention.

Figure 8B:
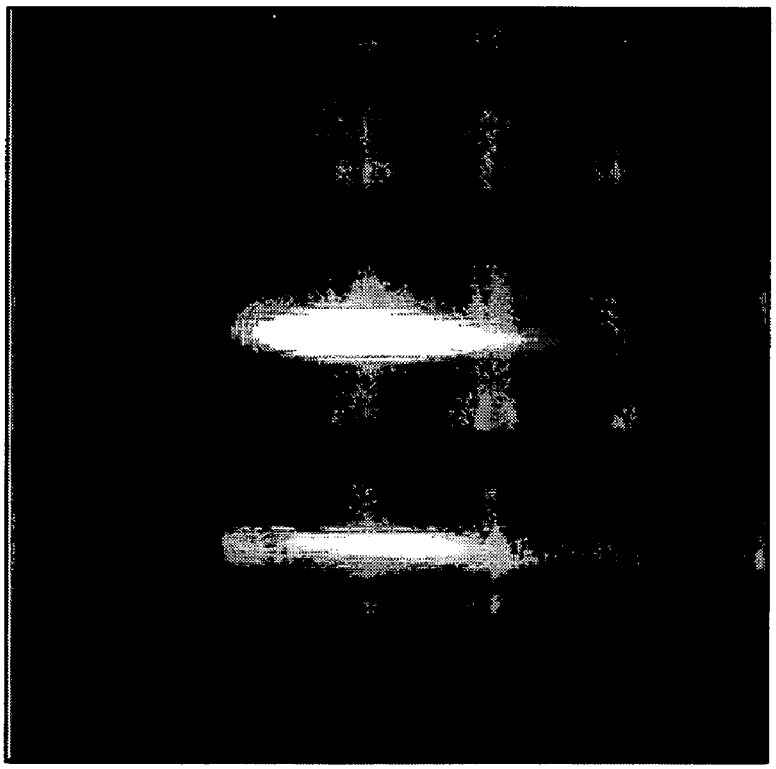
FIGS. 8(a) and 8(b) are in-situ orthogonal azimuthal angle RHEED pattern images of layer 214 in FIG. 3(a).
Figure 8A:
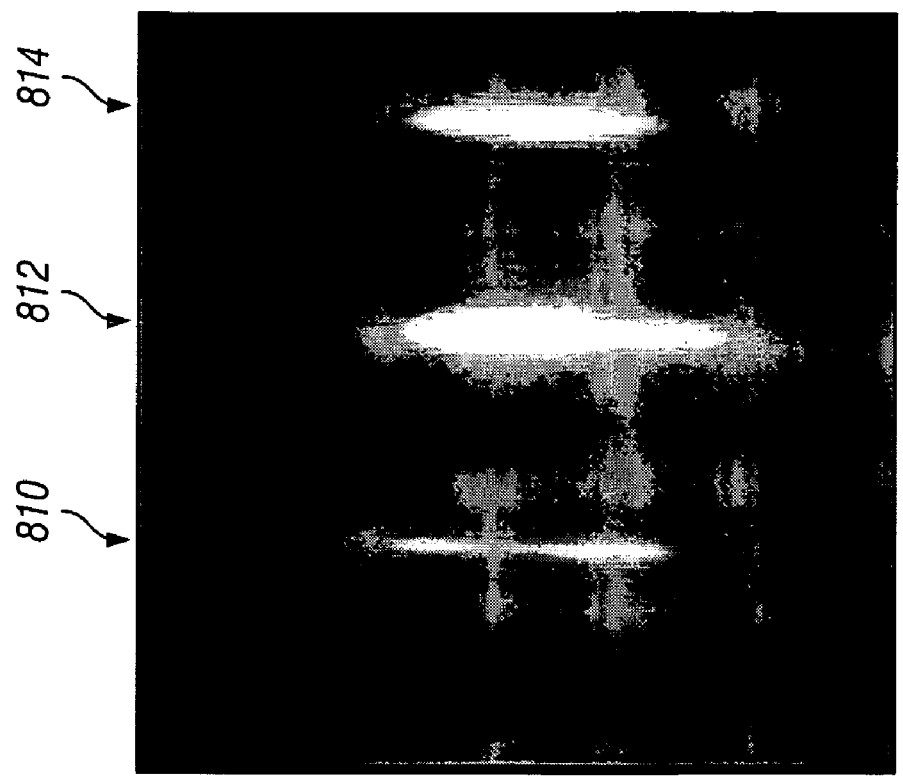

The RHEED pattern is used to advantage in growth of these new materials and structures, and proves conclusively that all of these new materials are indeed high quality low defect density pure single-crystal. FIGS. 8(a) and 8(b) are in-situ orthogonal azimuthal angle RHEED pattern images of layer 214 in FIG. 3(a). The long sharp RHEED streaks 810, 812 and 814 indicate excellent quality single crystal erbium oxide and two-dimensional layer-by-layer growth. The RHEED streaks 812 through 814 are clearly defined, long and parallel. In contrast, RHEED from rare-earth oxides grown according to the prior-art shows either no RHEED (amorphous) or highly diffuse spotty and or halo RHEED patterns (polycrystalline). The contrast between the RHEED patterns and subsequently the crystalline verses highly polycrystalline and or amorphous structures is clear. The inventor's method clearly produces high quality single-crystal structures, while the prior are capable only of duplicating those materials found in nature, e.g., highly polycrystalline or amorphous materials.

Figure 8C:
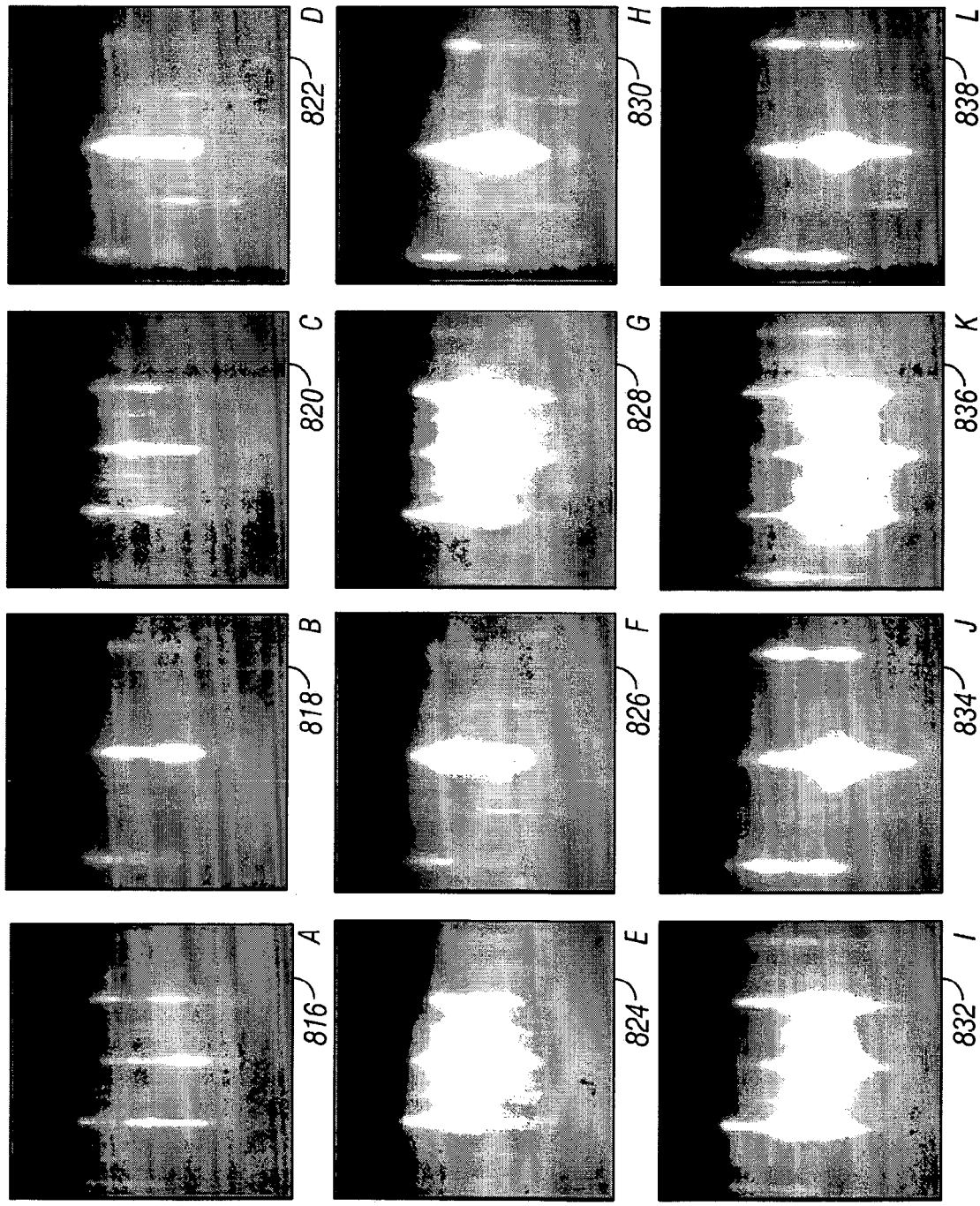
FIG. 8(c) is a RHEED pattern image of the single crystal silicon layer 212 grown over the single crystal erbium oxide layer 214 in FIG. 3(a).

FIG. 8(c) is a RHEED pattern image of the single crystal silicon layer 212 grown over the single crystal erbium oxide layer 214 in FIG. 3(a). RHEED images 816 through 838 of the layer 212 in FIG. 3(a) are shown for azimuthal crystal axis rotated in 30 degree increments, for a fixed incident electron beam. The images 816 through 838 indicate high quality single crystal Si 212 has been epitaxially deposited over the wide band gap single crystal erbium oxide insulator layer 214.

Figure 8E:
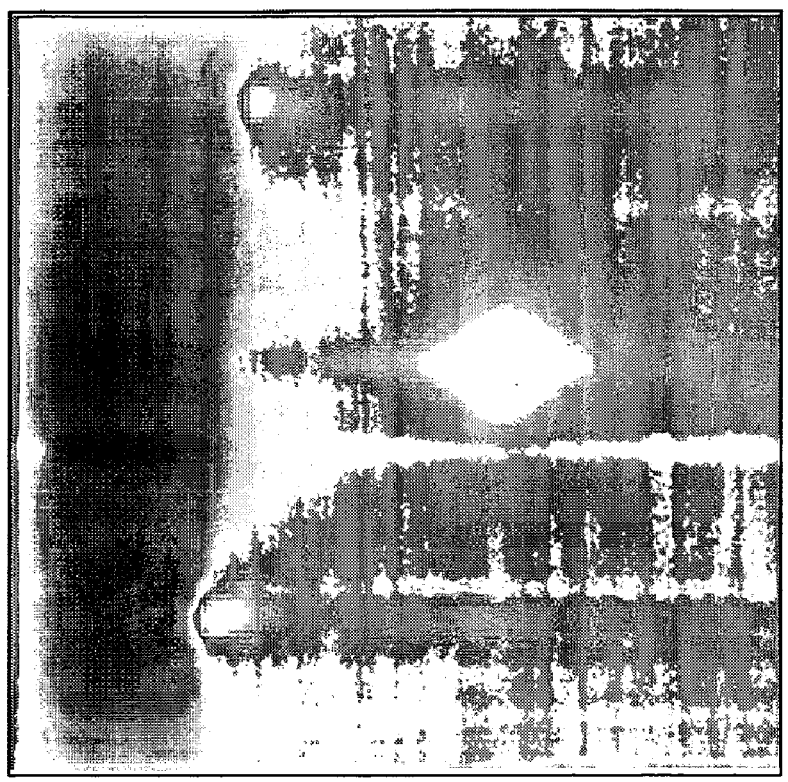
FIGS. 8(d) and 8(e) as the same as FIGS. 8(a) and 8(b) except they represent layer 314 in FIG. 3(b) with orthogonal azimuthal angles, for a fixed incident electron beam.
Figure 8D:
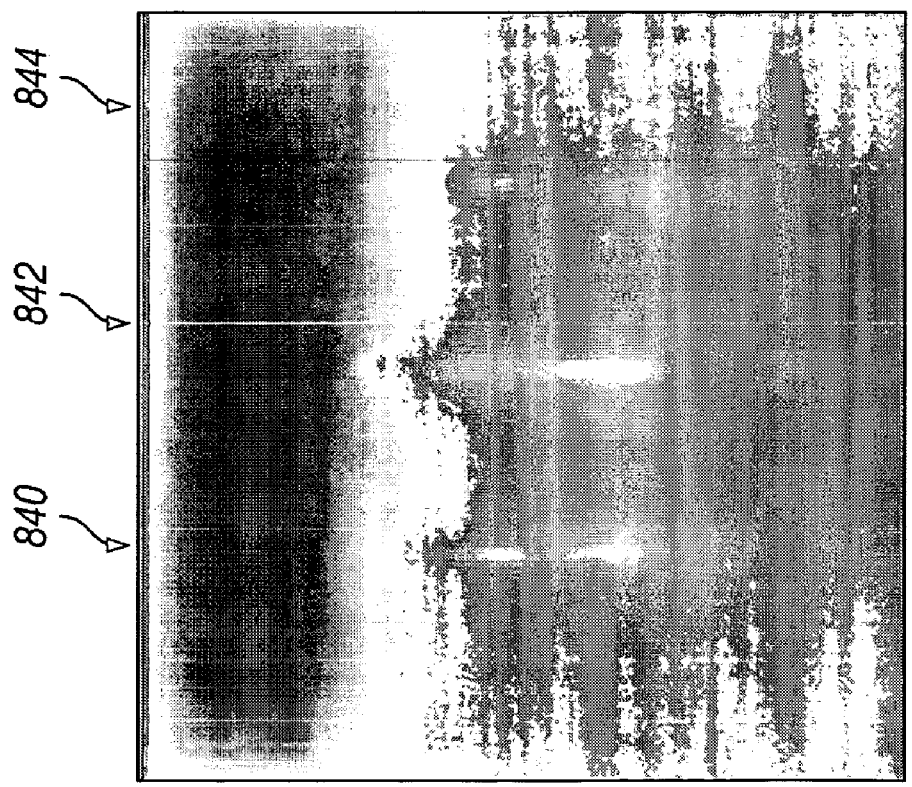

FIGS. 8(d) and 8(e) are the same as FIGS. 8(a) and 8(b) except they represent layer 314 in FIG. 3(b) with orthogonal azimuthal angles, for a fixed incident electron beam. The images show long sharp streaks 840, 842 and 844 indicating single crystal erbium oxide has been deposited in a 2.times.1 reconstruction.

Single crystal silicon can be advantageously grown onto wide band gap insulating films composed of single crystal rare-earth oxide. The SOI structures can be realized onto silicon substrates with substantially (001)-oriented surfaces, (111)-oriented surfaces, miscut surfaces with orientation deviated from either (001)-, (111)- or (011)-oriented surfaces.

Epilayer growth was monitored in-situ using real-time RHEED and near normal incidence reflectivity. Typical base pressure of the UHV system was about $1-3\times10^{-11}$ torr. Effusion cells were used for the evaporation of 4N$^+$-purity Er and 6N-purity Ge. Ultra low beam pressure plasma sources were used for the production of atomic and meta-stable oxygen and nitrogen species. Gas species and Si fluxes were monitored and stabilized using residual gas analyzers or optical emission sensors. Si was evaporated using high stability rod-fed or crucible electron beam evaporators.

Single crystal rare-earth oxides were grown on RCA cleaned Si(111) substrates. Clean Si surfaces were terminated with either a wet grown protective SiO$_2$ layer or were H-terminated using a final HF dip. Substrates were out gassed in UHV and then loaded in to the growth chamber. Prior to deposition, substrates were heated to 900.degree. C. until clear 7.times.7 surface reconstructions were observed by RHEED. Base pressure in the growth chamber during oxide removal never exceeded $2\times10^{-10}$ torr. After UHV annealing for 1-15 mins the substrate was rapidly cooled to growth temperature for buffer layer deposition of about 1000 Angstroms of intrinsic Si. RHEED exhibited very sharp, long and narrow streaks indicative of atomically flat and well defined Si surface. FIGS. 3(a) and 3(b) show schematically typical layer sequences deposited on Si(111)- and Si(001)-oriented substrates, respectively. Process sequence described in FIG. 3(b) has been grown at 500 and 700 degrees centigrade. Process sequence described in FIG. 3(b) has been grown at 500 and 700 degrees centigrade. A thermodynamically stabilized sequence of layers was grown to establish an atomic template prior to the growth of a pseudomorphic c-ErOx layer, representing the single crystal composition Er$_x$O$_y$ where x and y are real positive numbers. At no time did RHEED streaks disappear or was there any evidence of polycrystalline or amorphous growth. The single crystal rare-earth oxide and nitride films can be grown in the temperature range of 300 to 1000 degrees centigrade. The single crystal silicide layers can be grown at 300 to 800 degrees centigrade. Clearly, the deposition temperature of the process is compatible with standard CMOS processing.

In one embodiment of the present invention, a method is provided using RHEED patterns to provide feedback to the growth process. Since these materials have never been grown before in single-crystal form, then it follows that these techniques have never been previously applied to this process.

EXAMPLE 9

Figure 9:
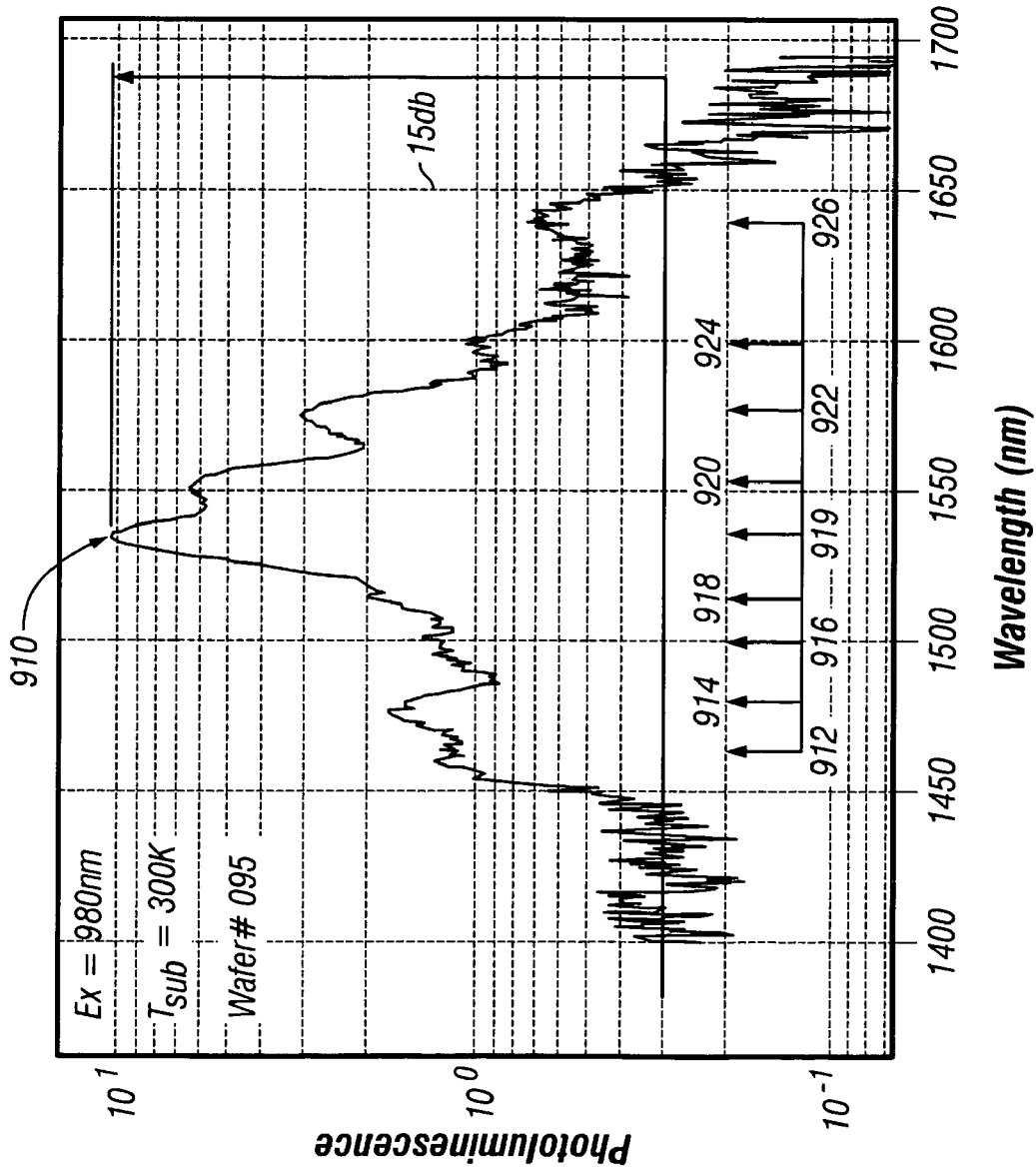
FIG. 9 illustrates the room temperature photoluminescence emission of the structure disclosed in FIG. 4(b) under 980 nm optical pumping.

In one embodiment of the present invention, photoluminescence (PLY is used for analyzing semiconductor wafers by changing the excitation wavelength of the PL tool from green (532 nm) to blue (488 nm), or infrared (980 nm), or ultraviolet (355 nm). Due to the pure-crystal nature of these rare earth oxides, nitrides, and phosphides, upon excitation with these new wavelengths, the wafers exhibit strong photoluminescence (PL) at wavelengths previously unavailable from silicon, even at room temperature. For example, when the rare earth used is erbium, these new materials emit strongly in the 1400 to 1680 nm band used for telecommunications. FIG. 9 shows the photoluminescence emission under 980 nm pumping, noting the distinct emission peaks, 910 through 926, which mark the specific transitions of the triply ionized rare-earth 4-f manifold. In an amorphous material, such as an erbium doped fiber, this splitting is impossible to observe. With one embodiment of the present invention, this characteristic is used as a precise tool for measuring crystallinity of the final structure. PL can be used as a non-invasive probe for optical signature identification of rare-earth materials.

In one embodiment of the present invention, rapid thermal anneal (RTA) techniques are used to modify the crystal quality of rare-earth films and or activate electrical dopants.

In another embodiment of the present invention, Raman scattering is utilized with short wavelength excitation for analyzing the crystal quality of epitaxially deposited thin films. By way of illustration, and without limitation, utrathin Si films deposited on single crystal rare-earth oxides, nitrides or phosphides are probed non-invasively for quality assessment. The very high optical absorption co-efficient in Si at short wavelengths (<400 nm) allows Raman spectra to be acquired from the topmost epilayer of an SOI structure created using the present invention.

In another embodiment of the present invention, atomic layer epitaxy (ALE) is utilized. The c-ErOx, c-ErN (representing the single crystal compounds $Er_xO_y$ and $Er_xN_y$), growth parameters can be manipulated such that the growth proceeds in a 2-dimensional layer-by-layer (2D-LbL) mode, controlled primarily by the metal deposition rate. The 2D-LbL growth mode is most advantageous for the deposition and growth of thin single crystal films with substantially highly uniform thickness across the substrate. ALE has been demonstrated by the inventor using a UHV chamber, a heated substrate disposed advantageously in front of elemental atomic and or molecular deposition sources, a method to modulate the source flux seen by the growing film, and a means of characterizing in-situ film quality. The c-ErOx surface can also be self terminated in a molecular oxygen and or nitrogen excess environment. An oxygen terminated c-ErOx surface has been observed to remain stable for periods up to 2 hours at elevated growth temperatures in excess of 700.degree. C. and chamber pressures <$10^{-9}$ torr.

EXAMPLE 10

Figure 10:
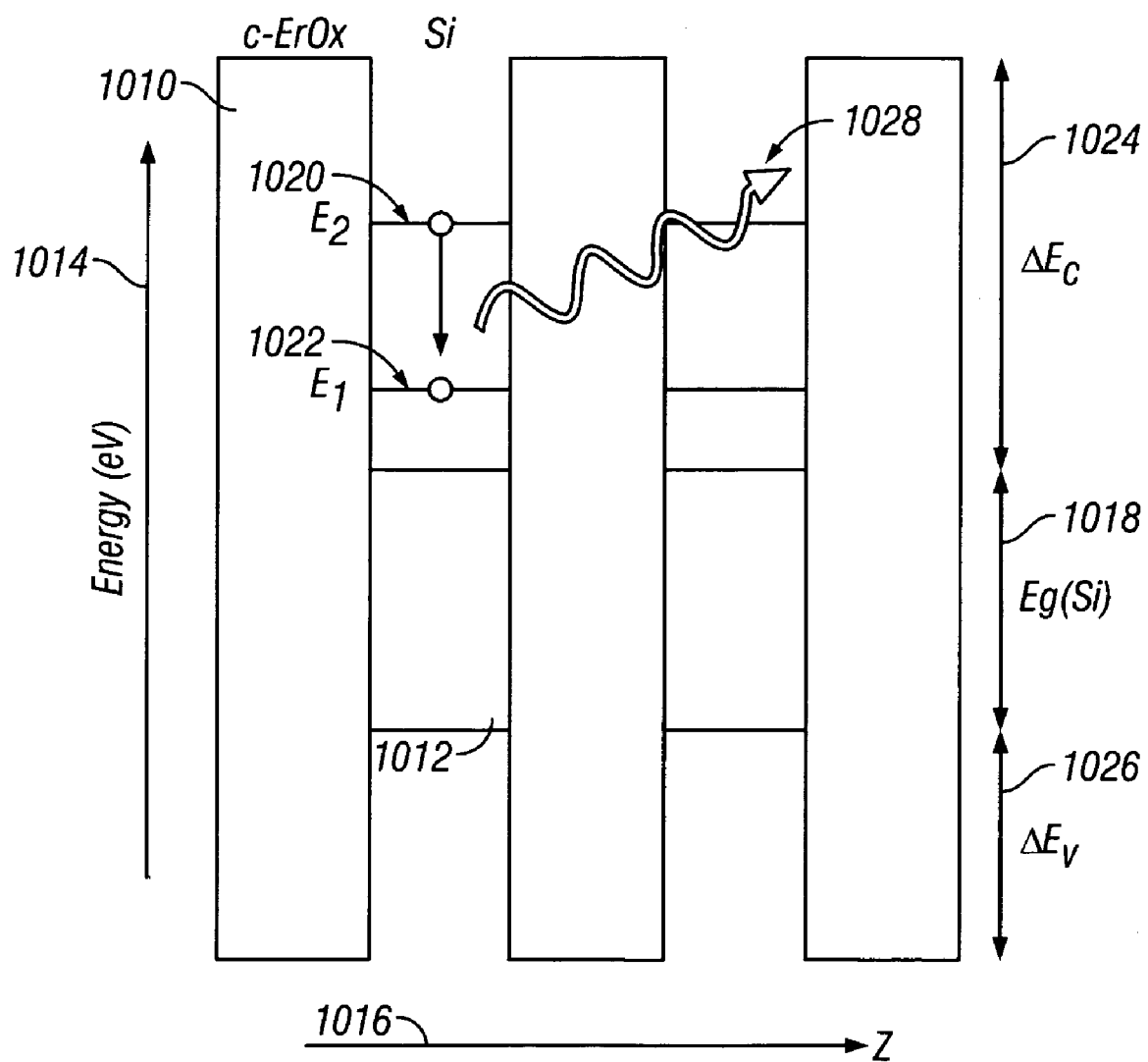
FIG. 10 illustrates a multilayer sequence composed of single crystal erbium oxide, of the present invention, constituting a wide band gap (WBG) layer 1010 and a single crystal silicon layer constituting the narrow band gap (NBG) layer 1012.

In another embodiment of the present invention, a multilayer structure comprising of an alternating sequence of wide band gap (WBG) energy material and narrow band gap (NBG) energy material can be constructed. By way of example, FIG. 10 illustrates a multilayer sequence composed of single crystal erbium oxide 1010, of the present invention, constituting the WBG layer, and single crystal silicon 1012 constituting the NBG layer. The vertical axis represents the electronic energy 1014 and the horizontal axis represents the layer growth direction 1016. The electronic band gap energy of erbium oxide 1010 is much greater than the band gap of silicon 1018 and therefore the silicon potential well effectively confines electrons and or holes in the NBG layer. For sufficiently thin layers, of the order of the deBroglie wavelength, quantized energy levels will occur in the potential well region. The electronic quantized energy levels 1020 and 1022 are shown due to the electronic confinement potentials 1024 and 1026. An optical transition 1028 between quantized energy levels energy is shown. Other compositions of the present invention can be advantageously applied to achieve desired electronic, optical and or magnetic properties. The optical transition 1028 can equivalently occur by electronic recombination from energy levels between the conduction and valence band.

In various embodiments of the present invention, compositions are provided of the following formulas:

(1) a rare-earth oxide of the formula: $[RE]_x[O]_y$, where x is 1 and y is 1.5, RE is at least one type of rare-earth metal atom and a majority of the composition is a single crystal.

(2) a binary single-crystal rare-earth nitride of the formula: $RE_xN_y$ where x is 1 and y is 1, RE is at least one type of rare-earth metal atom, and a majority of the binary rare-earth nitride is single crystal;

(3) a binary single-crystal rare-earth phosphide of the formula: $RE_xP_y$ where x is 1 and y is 1, RE is at least one rare earth metal atom, and a majority of the binary rare-earth phosphide is single crystal;

(4) a rare-earth oxy-nitride ternary of the formula $[RE]_x[O_{1-z}N_z]_y$, where x and y are real positive numbers less than 3 and z is greater or equal to zero and less than equal to 1, RE is at least one type of rare-earth metal atom, and a majority of the composition is single crystal;

(5) a silicon rare-earth oxide, nitride, phosphide ternary or quaternary alloy of the form:

$[(RE)_x(O \text{ or } N \text{ or } P)_y][Si \text{ or } Ge \text{ or } SiGe]_z$, where RE is at least one rare-earth metal, x, y and z are real positive numbers less than 5 and a majority of the composition is a single crystal;

(6) a ternary alloy of a non rare-earth metal atom with either rare-earth oxide, rare-earth nitride or rare-earth phosphide of the form:

$[(RE)_x(O \text{ or } N \text{ or } P)_y][M]_z$, where RE is at least one type of rare-earth metal, M is a non-rare-earth, x, y and z are real positive numbers less than 5 and a majority of the composition is a single crystal;

These compositions can, (i) have an arrangement of atoms with a substantially single ordered structure, (ii) be non-polycrystalline, (iii) be non-amorphous, (iv) vary from single-crystal to polycrystalline, and the like.

The specific formula configuration of each compound can be used advantageously to achieve a desired lattice constant, band gap energy, dielectric constant, refractive index, heterojunction offset and the like.

The specific formula configuration of each compound can be used advantageously to achieve a desired lattice constant, band gap energy, dielectric constant, refractive index, heterojunction offset and the like.

For composition (1), x may take values ranging from 1 to 2, and y can take the values of 1.5 and 3, that is, $1.0<=x<=2.0$ and $1.5<=y<=3.0$. The range of values are chosen to represent stoichiometric and or non-stoichiometric rare-earth oxides that are possible in single crystalline form. The crystal structural forms can be monoclinic, hexagonal, wurtzite, body centered cubic and others.

For example, the polymorph single crystal structures represented as $RE_{x=1}O_{y=1}$, $RE_{x=1}O_{y=2}$, $RE_{x=2}O_{y=3}$, $RE_{x=1}O_{y}$, where $1<=y<=3$, and or $RE_{x=1}O_{2-k}$ where $0<=k<=2$ are all possible.

By way of example, it is also understood that intermediate rare-earth oxides such as $RE_6O_{11}$, can be also represented as combinations of the above polymorphs as $RE_2O_{3.4}(REO_2)$.

As a further example of composition (1), the crystal structure represented by $RE_{x=1}O_{y=1.5+d}$, where d is a real positive number would indicate a non-stoichiometric crystal structure that is oxygen rich. Conversely, the crystal structure represented by $RE_{x=1}O_{y=1.5-d}$, where d is a real positive number, would represent a non-stoichiometric crystal structure that is oxygen deficient.

For composition (2) x and y are equal to one. Further, x and y can take the values greater or equal to 1 and less than or equal to 2, representing stoichiometric and or non-stoichiometric rare-earth nitrides that are possible in crystalline form. The structural forms can be monoclinic, hexagonal, wurtzite, body centered cubic and others.

As a further example of composition (2), the crystal structure represented by $RE_{x=1}N_{y=1+d}$, where d is a real positive number would indicate a non-stoichiometric crystal structure that is nitrogen rich. Conversely, the crystal structure represented by $RE_{x=1}N_{y=1-d}$, where d is a real positive number, would represent a non-stoichiometric crystal structure that is nitrogen deficient.

A further example of composition (2) are the polymorph single crystal structures represented as $RE_{x=1}N_{y=1}$, and $RE_{x=1}N_y$, where $1<=y<=2$.

For composition (3) x and y are equal to one. Further, x and y can take the values greater or equal to 1 and less than or equal to 2, representing stoichiometric and or non-stoichiometric rare-earth nitrides that are possible in crystalline form. The structural forms can be monoclinic, hexagonal, wurtzite, body centered cubic and others.

As a further example of composition (3), the crystal structure represented by $RE_{x=1}P_{y=1+d}$, where d is a real positive number would indicate a non-stoichiometric crystal structure that is phosphorus rich. Conversely, the crystal structure represented by $RE_{x=1}P_{y=1-d}$, where d is a real positive number, would represent a non-stoichiometric crystal structure that is phosphorus deficient.

Further examples of composition (3) are the polymorph single crystal structures represented as $RE_{x=1}P_{y=1}$, and $RE_{x=1}P_y$, where $1<=y<=2$.

For composition (4) x can have values between 1 and 2 ($1<=x<=2$), y can have values between 1 and 5 ($1<=y<=5$), and z can be chosen from $0<=z<=1$.

A further example of composition (4) is the empirical formula for a mixed oxy-nitride rare-earth ternary crystal structure of the form:

$(RE_2O_3)_a(RE_1N_1)_b$ where a and b are positive integers or real numbers, and may also be written as $RE_{(2a+b)}O_{(3a)}N_{(b)}$. Stoichiometric and non-stoichiometric crystalline structures are also possible. The structural forms can be monoclinic, cubic, hexagonal, wurtzite, body centered cubic and others. Advantageous incorporation of N into the rare-earth oxide structure can be used to modify the diffusion of oxygen through the crystal lattice. It has been found that only a few percent or less N incorporation in Er $(O_{xN_{1-x}})_{1.5}$ compounds, where $x>0.9$ can substantially reduce oxygen diffusion.

For composition (5) x can have values ranging from 1 to 2, y can have values ranging from 1.5 to 3, and z can be chosen from $0<=y<=2$. The structural forms can be monoclinic, cubic, hexagonal, wurtzite, body centered cubic and others.

Further examples include compositions using silicon oxides of the form silicon dioxide $SiO_2$, silicon monoxide SiO and substoichiometric $SiO_v$ where v is a positive number less than 1.

An example of composition (5) is $(SiO_2)_x(Er_2O_{3-})_{1-x}$, where x is a real positive number less than or equal to 1, and can be equivalently described by the formula $Si_xEr_{2(1-x)}O_{(-3-2x)}$.

Another example of composition (5) is $(SiO)_x(Er_2O_3)_{1-x}$, where x is a real positive number less than or equal to 1, and can be equivalently described by the formula $Si_xEr_{2(1-x)}O_{(-3-2x)}$.

Another example of composition (5) is $(SiO)_x(ErO)_{1-x}$, where x is a real positive number less than or equal to 1, and can be equivalently described by the formula $Si_xEr_{1-x}O$.

Similarly, silicon nitride compositions can be used such as $Si_3N_4$, $Si_1N_1$ or $SiN_v$, where v is a positive number less than or equal to 2.5.

Another example of composition (5) is $(SiN)_x(ErN)_{1-x}$, where x is a real positive number less than or equal to 1, and can be equivalently described by the formula $Si_xEr_{1-x}N$.

For composition (6), M is preferentially chosen from one or more of hafnium, zirconium or aluminum. By way of example and without limitation, the case of composition (6) as a single crystal oxide using Hafnium (Hf) is disclosed. The formula parameter z is chosen to be less than or equal to one and the RE species is chosen as Er. This alloy is substantially single crystal and allows the properties of hafnium to be advantageously utilized in single crystal form.

As a further example of composition (6) the composition $(HfO_2)_x(Er_2O_3)_{1-x}$, where x is a real positive number less than or equal to 1, and can be equivalently described by the formula $Hf_xEr_{2(1-x)}O_{(3-x)}$.

Yet another example of composition (6) is the composition $(HfO_2)_x(Er_1N_1)_{1-x}$, where x is a real positive number less than or equal to 1, and can be equivalently described by the formula $Hf_xEr_{(1-x)}O_{2x}N_{1-x}$.

Another example of composition (6) is the composition $(HfN)_x(Er_1N_1)_{1-x}$, where x is a real positive number less than or equal to 1, and can be equivalently described by the formula $Hf_xEr_{(1-x)}N$.

Rare-earth elements can be immediately preceding hafnium in the periodic table to add electrons to the inner 4f-shell. Because no outer electrons are added to compensate for the increased nuclear charge there is a contraction in atomic size. This is the well known "Lanthanide contraction".

In another embodiment of the present invention, single crystal rare-earth oxides (and rare-earth nitrides) are provided that are capable of advantageously stabilizing the cubic (fluorite) structure of hafnium oxide (hafnium nitride).

In various embodiments, each of the compositions can be, (i) at least 90% single crystal, (ii) at least 95% single crystal, (iii) at least 99% of single crystal, and the like.

The rare-earth can be any rare earth including but not limited to erbium and ytterbium, each of which can have atoms bonded in the triply ionized (3+) state.

In one embodiment, the compositions are grown on a structure or substrate made from at least one of, silicon, germanium and silicon germanium, GaAs, InP, SiC and $Al_2O_3$. In another embodiment, the compositions are grown on an amorphous substrate, including but not limited to, $SiO_2$, or a substantially amorphous ceramic and the like.

A layer can be formed on top of the compositions. Suitable materials for the layer include but are not limited to, silicon, germanium, silicon-germanium alloy and the like. In various embodiments, at least, (i) 90% of the layer is single crystal, 95% of the layer is single crystal, (iii) 99% of the layer is single crystal, and the like.

In other embodiments of the present invention, the compositions of (1) through (6) above, as well as all of their different embodiments, can be utilized in the structures of FIGS. 3(*a*), 3(*b*), 6 and 7. In these embodiments, a substantially single crystal active layer silicon on insulator material is the minimum requirement for SOI applied to ULSI technologies. A further improvement to current SOI technologies is the introduction and use of a single crystal insulator layer beneath the aforementioned silicon active layer. A further feature of the present invention is the in-situ epitaxial growth of single crystal rare-earth oxide and or rare-earth nitride and or rare-earth phosphide. Using the growth technique of the present invention, a single crystal rare-earth insulator can be deposited as an ultrathin film or bulk layer and the final surface will be atomically flat with well defined crystal symmetry. Further, a pure single crystal silicon and/or germanium and/or compound silicon-germanium active layer can be grown epitaxially on top this single crystal insulator layer. The interfacial quality between the single crystal Si active layer and the crystalline insulator can potentially have a very low defect density. Under the correct conditions this crystalline oxide/Si layer sequence can be grown on Si substrates.

The structures of FIGS. 3(*a*), 3(*b*), 6 and 7 may have another rare-earth oxide, nitride or phosphide layer deposited on top in-situ to form an SOI and or high-k gate oxide stack. This structure would preserve the active Si layer and gate oxide interface quality. Alternatively, an amorphous and or polycrystalline gate oxide, such as $SiO_xN_y$ may be used. Regardless, a double gate FET structure could be readily realized.

A further utility of the single crystal rare-earth oxide, nitride or phosphide for use as a FET gate oxide replacement is in the area gate stack dopant diffusion. Typically, conventional FET processes flows use a doped polycrystalline Si gate contact layer deposited onto the $SiO_2$ gate oxide. Unfortunately, to activate the dopant in the polycrystalline Si contact layer very high temperatures are required. During the anneal or activation the dopant species, for example Boron atoms, deleteriously migrate into the gate oxide. For ultrathin $SiO_2$ gate oxides this is a severe limitation. The present invention potentially solves this problem. If single crystal rare-earth oxide is used as the FET gate dielectric layer(s), subsequent deposition of appropriately doped single crystal Si can be used as the gate contact layer. The advantage of this process flow is that dopant species diffusivity is lower in single crystal Si than in amorphous or polycrystalline Si. Therefore, the problem of dopant penetration from the gate stack into the gate dielectric layer is reduced or removed.

In other embodiments of the present invention, the large heterojunction valence and conduction band offsets exhibited by using silicon and rare-earth oxides and or nitrides allows quantum confinement of charge carriers to occur. By way of illustration, and without limitation, a multilayer sequence such as described in FIG. 10, is provided that includes at least one period of c-ErOx/Si/c-ErOx. For Si layer thickness of the order of the electron deBroglie wavelength about 100 Angstroms, the narrow band gap Si potential well has quantized energy levels in the conduction and valence bands. This is analogous to gallium arsenide (GaAs)/gallium aluminum arsenide (GaAlAs) quantum well. However, the c-ErOx/Si/c-ErOx quantum well offers advantageously increased electron and hole confinement energies of several electron volts.

For the extended case of many periods of c-ErOx/Si/c-ErOx and individual layer thickness less than about 100 Angstroms, the quantum wells become coupled and electronic minibands form in the conduction and valence bands. The quantum well analogy of the present invention allows for the first time complex quantum electronic materials to be realized in the silicon system. Similar condition hold true for single crystal rare-earth nitrides, phosphides and ternaries described above.

A further aspect of the present invention is that both the active Si layer and buried insulator thicknesses can be individually deposited with thickness ranging from a few angstroms to several microns. Therefore, SOI structures can have optimized active Si layer and BOX layer thickness. This aspect is unique to the present invention when applied to fully depleted silicon-on-insulator substrates. The BOX layer is an insulator with high dielectric constant and therefore need only be several nanometers in thickness.

A further advantage of the present invention applied to SOI substrates using rare-earth metal oxide BOX layer is in the area of thermal dissipation. The thermal conductivity of $SiO_2$ is approximately one hundred times lower than single crystal Si. It is well known that submicron transistor self-heating effects are problematic in ULSI FETs implemented on conventional SOI substrates. The present invention potentially alleviates this self-heating problem as the rare-earth metal oxides, nitrides and or phosphides exhibit substantially higher thermal conductivity than $SiO_2$.

A further aspect of the present invention is a multiple layer periodic or aperiodic sequence or permutation of epitaxial growth of rare-earth oxide and or rare-earth nitride and or rare-earth phosphide and/or silicon and/or silicon-germanium.

Figure 11:
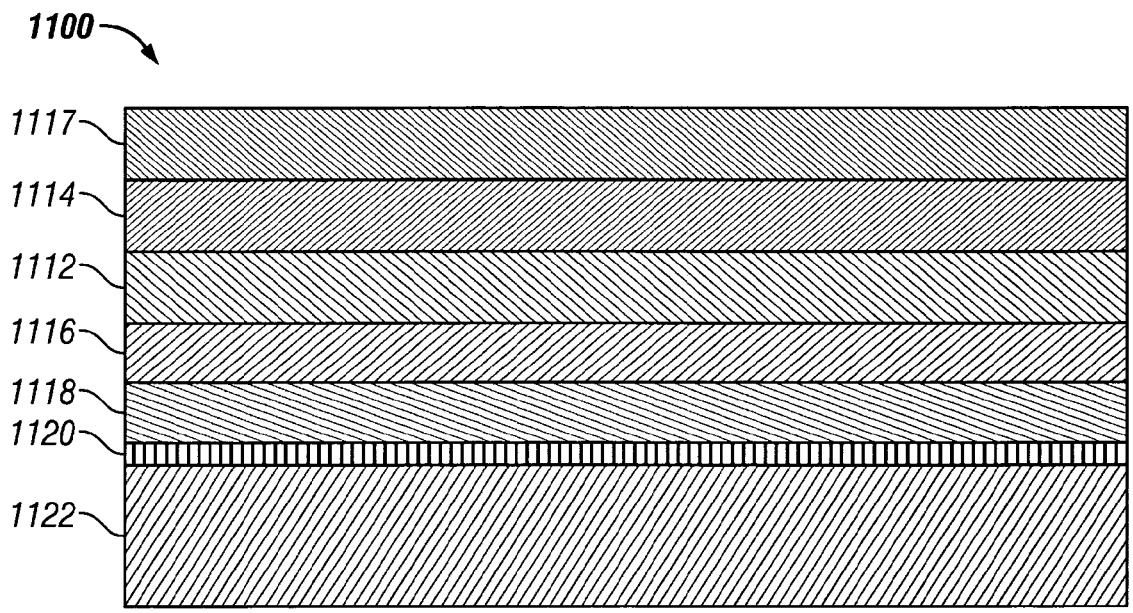
FIG. 11 illustrates one embodiment of a transistor gate dielectric structure 1110 of the present invention.

In other embodiments of the present invention, the electronic transistor gate dielectric structures for an integrated circuit is disclosed. FIG. 11 illustrates one embodiment of an electronic transistor gate dielectric structure 1110 of the present invention. A first insulator and or dielectric layer 1118 is grown over a template layer and or buffer 1120. The dielectric layer 1118 is a single crystal rare-earth containing layer according to compositions of (1) through (6) above. A first semiconductor layer 1116 is deposited upon the first dielectric layer 1118. The semiconductor layer 1116 is preferably a single crystal semiconductor epitaxially deposited upon the single crystal dielectric layer 1118 according to the present invention. The multi-layers are deposited over a substrate 1122. A second dielectric layer 1112 is deposited over the first semiconductor layer 1116. This basic layer sequence forms a single crystal semiconductor layer 1116 sandwiched by two dielectric layers. This basic structure is used to form a field effect transistor that is disposed upon an insulating substrate. Alternatively, the said structure forms a double gate field effect transistor. At least one of the dielectric layers 1112 and 1118 are made of the compositions of (1) through (6) above, as well as their various embodiments. The semiconductor layer 1116 is chosen preferentially as a single crystal silicon and or germanium layer. Each of the dielectric layers 1112 and or 1118 can be made of the single crystal compositions of (1) through (6) above, as well as their various embodiments.

Structures 1110 can have repeating units. By way of illustration, a third dielectric layer 1117 and a second semiconductor layer 1114 are deposited. If the second dielectric layer 1112 is made of the single crystal compositions of (1) through (6) above, then the second semiconductor layer can be single crystal in structure. The semiconductor layer 1114 is positioned between the second and third dielectric layers 1117 and 1112, respectively.

It will be appreciated that four or more dielectric layers can be provided. The third dielectric layer can be made of the compositions of (1) through (6) above. Therefore, it is clear that the use of single crystal compositions of (1) through (6) above, allows construction of single crystal multi-layers of semiconductor and insulator sequences, thereby allowing the entire structure to be single crystal.

Preferably, the substrate 1122 is chosen from single crystal silicon. The first semiconductor layer is chosen from single crystal silicon and or germanium. The first dielectric layer 1118 is chosen from substantially single crystal compositions of (1) through (6) above.

Figure 12:
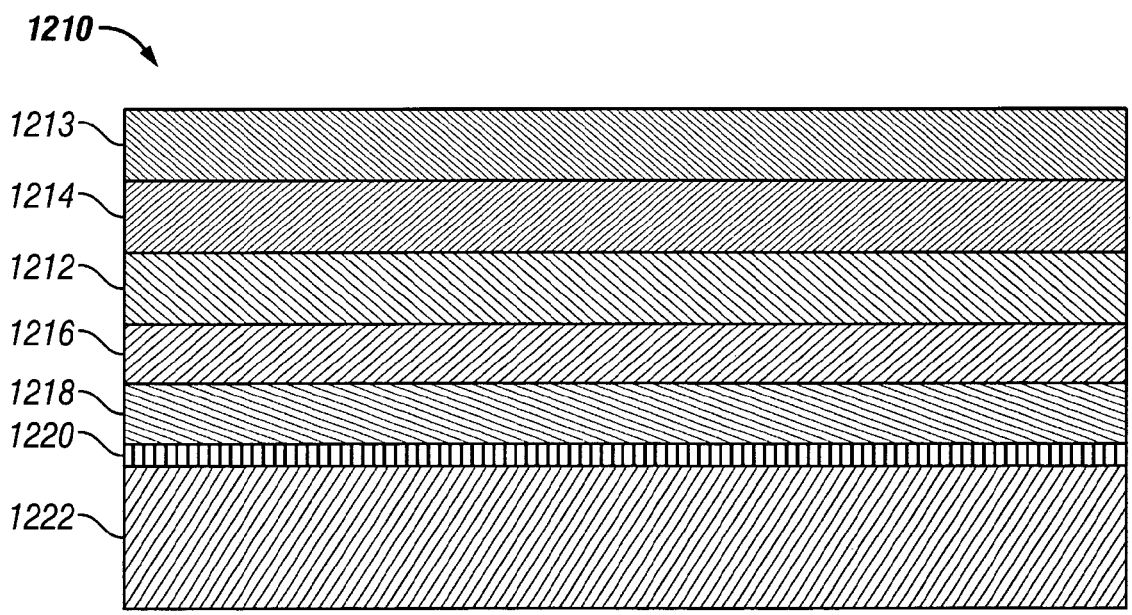
FIG. 12 illustrates one embodiment of a high-k dielectric structure 1210 of the present invention.

In other embodiments of the present invention, high-k dielectric structures for an integrated circuit, generally denoted as 1210 and illustrated in FIG. 12, are provided. FIG. 12 illustrates one embodiment of a high-k dielectric structure of the present invention 1210. A substantially single crystal insulator layer 1218 is grown over a template and or buffer layer 1220. The multi-layers are deposited over a substrate 1222. A first single crystal semiconductor layer 1216 is epitaxially deposited upon the first dielectric layer 1218. Second 1212 and third 1214 dielectric layers are deposited upon the first semiconductor layer 1216. Further, optional second semiconductor layer 1213 is deposited upon dielectric layers 1212 and 1214.

At least one of the dielectric layers 1218, 1214 and or 1212 is a high-k dielectric layer made of the compositions of (1) through (6) above, as well as their various embodiments.

In one specific embodiment, the substrate 1222 is single crystal silicon. The dielectric layer 1218 is a single crystal insulator according to the present invention compositions of (1) through (6) above. Semiconductor layer 1216 is a single crystal silicon and or germanium active layer. At least one of the dielectric layers 1212 and 1214 are high-k single crystal insulator layers according to present invention compositions of (1) through (6) above. Semiconductor layer 1213 is a single crystal gate contact layer composed of doped-silicon and or silicide. Other embodiments of the present invention are the use of conventional dielectric layers, such as silicon oxynitride $SiO_xN_y$ and or hafnium oxynitride $HfO_xN_y$, as the second and or third dielectric layers. The use of conventional dielectric layers as the third dielectric layer 1214 would necessarily limit the second semiconductor layer 1213 to be other than a single crystal semiconductor.

Structures 1210 can have repeating units and it will be appreciated that four or more dielectric and semiconductor layers can be provided.

In other embodiments of the present invention, Si micro- and nano-electronic devices, similar to structures 1110 and 1210, are provided. Such devices can include are not limited to, double gate field effect transistors (FETs), vertical gate FETs (such as FinFETs), electronic memories, magnetic sensors and storage, semiconductor optical amplifiers, semiconductor photodetectors, semiconductor lasers and the like.

In one embodiment a photonic device of the present invention comprises silicon monolayers, erbium atoms and crystal growth modifiers.

A photonic device can be an LED, amplifier, laser, photodetector, AWG, modulator, phototransistor, quantum logic gate, photonic bandgap structure, FET, MOSFET, HFET, HBT, waveguide, and the like.

In one embodiment, a superlattice includes at least one amorphous layers. In another embodiment, at least one of the layers in at least one repeating unit has an amorphous layer. At least one crystal growth modifier can be included in an individual layer of each repeating unit. Suitable growth modifiers include but are not limited to C, As, P, B, H, O, N, Sn, Pb and the like. Additionally, during the deposition of each layer, additional iso-electronic centers can be added, including but not limited to oxygen, nitrogen and the like, to enhance or activate the rare-earth and control the deposition growth or surface structure of the atoms (i.e., the reconstruction).

A photonic device includes a superlattice that can be made of a variety of different layers and combinations thereof, including but not limited to, silicon, silicon germanium, silicon oxide, oxygen-doped silicon, RE-doped silicon, rare earth silicates ($Re_x Si_{1-x}$), rare earth silicon germanium ($Re_x(SiGe)_{1-x}$) and the like. In one embodiment, a superlattice consists of dissimilar materials of type A, B and C in repeating units, for example, of the type (ABA . . . ABA), or (ABCABC . . . ABC). The number and composition of repeating units is determined by the rare-earth ion interaction cross-section or density required; i.e., to increase interaction cross-section, either the number of layers is increased, or the rare earth density in each active layer is increased, or a combination of both. The density of the rare-earth ion is determined by the stoichiometry of the layer which includes the rare-earth ion.

In one embodiment of the ABA repeating unit layer sequence, the A layer is an oxygen deficient erbium silicide, represented as $Er_x Si_{1-material}$, or an erbium containing silicon-germanium material, represented as $Er_x(Si_y Ge_{1-y})_{1-x}$. The B layer is an oxygen containing non-stoichiometric or stoichiometric silicon-based material such as $SiO_x$, $SiGeO_x$, or oxygen-doped silicon.

A photonic device can have at least one spacer layer between two adjacent repeating units. Additionally, a spacer layer can be positioned between more than one pair of adjacent repeating units, including all adjacent repeating units. The spacer layer is used to improve the structural quality, symmetry, optical quality, or electronic quality of the superlattice. Additionally, a superlattice can be positioned or grown on a substrate, including but not limited to a silicon substrate, or on a pseudo-substrate buffer layer that has a lattice constant which is different from a lattice constant of a bulk silicon substrate. Where a pseudo substrate is defined as thick layer with low defect surface density that is grown over the substrate.

In various embodiments, an active region layer has a lattice layer that is less than, the same as or equal to a lattice constant of a silicon substrate or pseudo-substrate buffer layer. It may be preferred for an active region layer containing the rare-earth atoms to be in a mechanically stressed state when grown epitaxially on silicon substrate or pseudo substrate by either tension, lattice mismatching or compression. This reduces the defect density which in turn improves structural quality.

Repeating units can have, (i) uniform layer constructions, (ii) non-uniform layer constructions, (iii) thickness that vary as a function of distance along a superlattice growth direction, (iv) layer chemical compositions and layer thickness that vary as a function of distance along a superlattice growth (v) at least two individual layers, (vi) at least two individual layers that have different thickness, (vii) at least two individual layers that are made of different compositions, (viii) at least three individual layers that are made of different compositions, (ix) a silicon layer that includes rare earth ions, (x) a silicon germanium layer, (xi) a silicon oxide layer, (xii) an oxygen-doped silicon layer, (xiii) a rare earth silicide layer, (xiv) a rare earth silicon germanium layer, (xv) an electrically doped p- or n-type layer or (xvi) hydrogenated silicon, silicon oxynitride, hydrogenated silicon oxynitride, the same thickness and a thickness of the individual layers of the repeating units varies as a function of distance along a superlattice growth direction.

Some embodiments comprise full VLSI functionality including all electrical functions currently employed in silicon VLSI such as memory, switching, gain, computation, fuzzy logic, error checking, and restoration.

The foregoing description of various embodiments of the present invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

The invention claimed is:

1. A semiconductor-on-insulator structure comprising:
a substrate layer comprising a first surface;
a single crystal semiconductor layer; and
an insulator layer interposed between the substrate layer and the semiconductor layer, the insulator layer comprising first and second component layers wherein each component layer comprises at least one material combination chosen from:

[Q] or [Q][RE] or [RE][J]

wherein [RE] is chosen from a group consisting of Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb) and Lutetium (Lu); [Q] is chosen from a group consisting of silicon, germanium and SiGe mixtures; [J] is chosen from a group consisting of Oxygen (O), and Nitrogen (N) such that the insulating layer is at least 90% single crystal and at least one component layer comprises a rare earth wherein the first component layer is in contact with the first surface and is polycrystalline or single crystal.

2. The structure of claim 1, wherein atoms of the rare-earth, [RE] are bonded in the triply ionized (3+) state.

3. The structure of claim 1, wherein the insulator layer is grown on a substrate made from at least one of, silicon, germanium, silicon germanium, GaAs, InP, SiC and $Al_2O_3$.

4. The structure of claim 1 wherein said single crystal semiconductor layer is at least one of silicon, germanium and silicon germanium formed over the insulator layer.

5. The structure of claim 1 wherein at least one of said one or more component layers further comprises at least one constituent chosen from a group comprising a crystal growth modifier and an iso-electronic center; wherein the crystal growth modifier is chosen from a group comprising C, As, P, B, H, O, N, Sn and Pb and the iso-electronic center is chosen from a group comprising oxygen and nitrogen.

* * * * *